United States Patent
Kang et al.

(10) Patent No.: US 11,121,284 B2
(45) Date of Patent: Sep. 14, 2021

(54) SEMICONDUCTOR DEVICE AND SEMICONDUCTOR DEVICE PACKAGE COMPRISING SAME

(71) Applicant: SUZHOU LEKIN SEMICONDUCTOR CO., LTD., Taicang (CN)

(72) Inventors: Ki Man Kang, Seoul (KR); Eun Dk Lee, Seoul (KR); Hyun Soo Lim, Seoul (KR); Youn Joon Sung, Seoul (KR)

(73) Assignee: SUZHOU LEKIN SEMICONDUCTOR CO., LTD., Suzhou (CN)

(*) Notice: Subject to any disclaimer, the term of this patent is extended or adjusted under 35 U.S.C. 154(b) by 0 days.

(21) Appl. No.: 16/343,626

(22) PCT Filed: Oct. 20, 2017

(86) PCT No.: PCT/KR2017/011661
§ 371 (c)(1),
(2) Date: Apr. 19, 2019

(87) PCT Pub. No.: WO2018/074885
PCT Pub. Date: Apr. 26, 2018

(65) Prior Publication Data
US 2020/0052156 A1    Feb. 13, 2020

(30) Foreign Application Priority Data
Oct. 21, 2016  (KR) .................. 10-2016-0137808

(51) Int. Cl.
*H01L 33/10* (2010.01)
*H01L 33/24* (2010.01)
(Continued)

(52) U.S. Cl.
CPC .............. *H01L 33/10* (2013.01); *H01L 33/24* (2013.01); *H01L 33/305* (2013.01); *H01L 33/38* (2013.01); *H01L 33/405* (2013.01); *H01L 33/46* (2013.01)

(58) Field of Classification Search
CPC ..... H01L 33/10; H01L 33/305; H01L 33/405; H01L 33/382; H01L 33/38; H01L 33/24; H01L 33/32; H01L 33/46
See application file for complete search history.

(56) References Cited

U.S. PATENT DOCUMENTS

2006/0209529 A1* 9/2006 Son ...................... H01L 51/5206
                                                            362/84
2009/0283787 A1* 11/2009 Donofrio .............. H01L 33/405
                                                            257/98
(Continued)

FOREIGN PATENT DOCUMENTS

JP    2014-103245    6/2014
JP    2014-209668    11/2014
(Continued)

OTHER PUBLICATIONS

International Search Report (with English Translation) and Written Opinion dated Jan. 29, 2018 issued in Application No. PCT/KR2017/011661.

*Primary Examiner* — Vongsavanh Sengdara
(74) *Attorney, Agent, or Firm* — Birch, Stewart, Kolasch & Birch, LLP

(57) ABSTRACT

Disclosed in an embodiment is a semiconductor device comprising: a light-emitting structure including a first conductive semiconductor layer, a second conductive semiconductor layer, and an active layer disposed between the first conductive semiconductor layer and the second conductive semiconductor layer; a first electrode electrically connected to the first conductive semiconductor layer; a second elec-
(Continued)

trode electrically connected to the second conductive semiconductor layer; a reflective layer disposed on the second electrode and including a first metal; and a nitride of the first metal between the second electrode and the reflective layer.

17 Claims, 17 Drawing Sheets

(51) Int. Cl.
  *H01L 33/30* (2010.01)
  *H01L 33/38* (2010.01)
  *H01L 33/40* (2010.01)
  *H01L 33/46* (2010.01)

(56) References Cited

U.S. PATENT DOCUMENTS

| | | | |
|---|---|---|---|
| 2011/0215291 A1* | 9/2011 | Ito | B82Y 20/00 |
| | | | 257/13 |
| 2014/0219304 A1 | 8/2014 | Lee et al. | |
| 2014/0252390 A1 | 9/2014 | Yoon et al. | |
| 2018/0003576 A1* | 1/2018 | Gregory | G01L 1/2293 |
| 2018/0309029 A1* | 10/2018 | Kim | H01L 33/405 |

FOREIGN PATENT DOCUMENTS

| | | |
|---|---|---|
| KR | 2013-0105565 | 9/2013 |
| KR | 2014-0099379 | 8/2014 |
| KR | 2014-0111512 | 9/2014 |

* cited by examiner

SEMICONDUCTOR DEVICE AND SEMICONDUCTOR DEVICE PACKAGE COMPRISING SAME

CROSS-REFERENCE TO RELATED PATENT APPLICATIONS

This application is a U.S. National Stage Application under 35 U.S.C. § 371 of PCT Application No. PCT/KR2017/011661, filed Oct. 20, 2017, which claims priority to Korean Patent Application No. 10-2016-0137808, filed Oct. 21, 2016, whose entire disclosures are hereby incorporated by reference.

TECHNICAL FIELD

Embodiments of the present invention relate to a semiconductor device and a semiconductor device package including the same.

BACKGROUND ART

Semiconductor devices including compounds such as GaN, AlGaN, and the like can have many advantages such as wide and easily adjustable energy band gap and the like and can be variously used as light-emitting elements, light-receiving elements, and various diodes.

In particular, light-emitting elements such as light-emitting diodes or laser diodes using a compound semiconductor material including a III-V group element or a II-VI group element can realize various colors of light such as red light, green light, blue light, and ultraviolet light with the development of thin film growth technology and element materials and also realize white light having high efficiency by using a fluorescent material or combining colors. The light-emitting elements have advantages such as low power consumption, semi-permanent lifetime, fast response speed, safety, and environmental friendliness as compared to the conventional light sources such as fluorescent lamps, incandescent lamps, and the like.

In addition, light-receiving elements such as photodetectors or solar cells, which are manufactured using a compound semiconductor material including a III-V group element or a II-VI group element, can utilize light in various wavelength ranges from gamma rays to radio wavelengths by generating a photoelectric current by absorbing light in various wavelength ranges with the development of element materials. Further, the light-receiving elements have advantages such as fast response speed, safety, environmental friendliness, and simple control of element materials, and thus can be easily used for power control, microwave circuits, or communication modules.

Therefore, semiconductor devices are increasingly applied to transmission modules of optical communication means, light-emitting diode backlights replacing cold-cathode fluorescent lamps (CCFLs) constituting backlights of a liquid-crystal display (LCD) devices, white light-emitting diode lighting devices that can replace fluorescent lamps or incandescent bulbs, automotive headlights, traffic lights, and sensors that detect gas and fire. Further, the semiconductor devices can be applied to high frequency application circuits, other power control devices, and communication modules.

In particular, light-emitting elements that emit light in an ultraviolet wavelength range can be used for curing a liquid, medical usage, and sterilization by performing curing or sterilizing actions.

Recently, research on ultraviolet light-emitting elements has been actively conducted. However, there are problems in that the ultraviolet light-emitting elements are still difficult to realize in a vertical form and have relatively low light extraction efficiency.

DISCLOSURE

Technical Problem

Embodiments of the present invention are directed to providing a semiconductor device with improved light extraction efficiency.

Embodiments of the present invention are also directed to providing a semiconductor device with improved reliability and light extraction efficiency by improving an adhesive force between an electrode and a reflective layer.

Technical Solution

One aspect of the present invention provides a semiconductor device including a light-emitting structure including a first conductive semiconductor layer, a second conductive semiconductor layer, and an active layer disposed between the first conductive semiconductor layer and the second conductive semiconductor layer; a first electrode electrically connected to the first conductive semiconductor layer; a second electrode electrically connected to the second conductive semiconductor layer; a reflective layer disposed on the second electrode and including a first metal; and a nitride of the first metal between the second electrode and the reflective layer.

Another aspect of the present invention provides a semiconductor device including a light-emitting structure including a first conductive semiconductor layer, a second conductive semiconductor layer, and an active layer disposed between the first conductive semiconductor layer and the second conductive semiconductor layer; a first electrode electrically connected to the first conductive semiconductor layer; a second electrode electrically connected to the second conductive semiconductor layer; and a reflective layer disposed on the second electrode and including a first metal, wherein the second electrode includes a first layer and a second layer disposed between the first layer and the reflective layer, the first layer includes a metal oxide, and the second layer includes a metal oxynitride.

Still another aspect of the present invention provides a semiconductor device package including a body; and a semiconductor device disposed in the body, wherein a light-emitting structure including a first conductive semiconductor layer, a second conductive semiconductor layer, and an active layer disposed between the first conductive semiconductor layer and the second conductive semiconductor layer; a first electrode electrically connected to the first conductive semiconductor layer; a second electrode electrically connected to the second conductive semiconductor layer; a reflective layer disposed on the second electrode; and a nitride of the first metal between the second electrode and the reflective layer.

Yet another aspect of the present invention provides a method of manufacturing a semiconductor device, which includes forming a light-emitting structure including a first conductive semiconductor layer, a second conductive semiconductor layer, and an active layer disposed between the first conductive semiconductor layer and the second conductive semiconductor layer; depositing an electrode on the second conductive semiconductor layer; and forming a reflective layer including a first metal on the electrode, wherein a nitride of the first metal may be included between the electrode and the reflective layer.

Advantageous Effects

According to embodiments, it is possible to manufacture a semiconductor device with excellent light extraction efficiency.

Further, it is possible to manufacture a semiconductor device with improved reliability and light extraction efficiency by improving an improved adhesive force between an electrode and a reflective layer.

Various and advantageous advantages and effects of the present invention are not limited to the above description and can be more easily understood in descriptions of specific embodiments of the present invention.

MODES OF THE INVENTION

Embodiments may be modified to other forms or various embodiments may be combined with each other. The scope of the present invention is not limited to each embodiment described below.

Although the content in a specific embodiment is not described in another embodiment, the contents may be understood as being related to another embodiment unless otherwise described or contradicted by those in another embodiment.

For example, in the case in which a feature for a component A is described in a specific embodiment and a feature for a component B is described in another embodiment, although an embodiment in which the component A and the component B are combined is not explicitly described, the embodiment should be understood as being included in the present invention unless otherwise indicated or contradicted.

In the description of the embodiments, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, the term "on (above)" or "under (below)" includes a case in which another element is disposed in an upward direction or a downward direction with respect to one element.

Semiconductor devices may include various types of electronic elements such as light-emitting elements, light-receiving elements, and the like. Both of the light-emitting element and the light-receiving element may include a first conductive semiconductor layer, an active layer, and a second conductive semiconductor layer.

Semiconductor devices according to embodiments of the present invention may be light-emitting elements.

A light-emitting element emits light by recombination of electrons and holes and a wavelength of the light is determined by a unique energy band gap of a material. Therefore, the emitted light may vary depending on a composition of the material.

Hereinafter, embodiments of the present invention that are easily performed by those skilled in the art will be described in detail with reference to the accompanying drawings.

Figure 1:
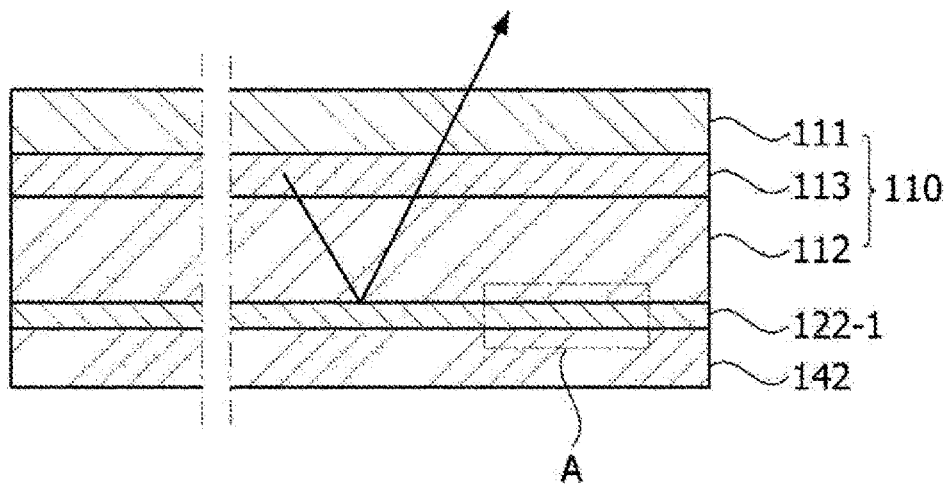
FIG. 1 is a conceptual diagram of a semiconductor device according to a first embodiment of the present invention.
Figure 2:
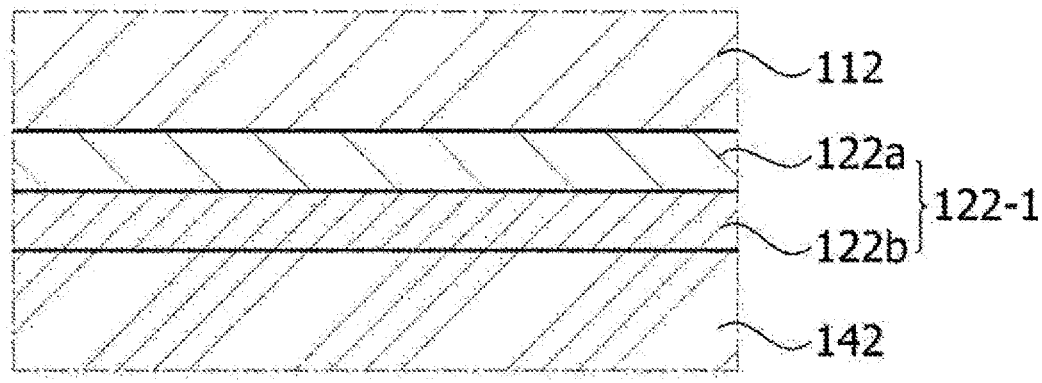
FIG. 2 is an enlarged view of a portion A of FIG. 1.

FIG. 1 is a conceptual diagram of a semiconductor device according to a first embodiment of the present invention and FIG. 2 is an enlarged view of a portion A of FIG. 1.

The semiconductor device according to the embodiment of the present invention may output light in an ultraviolet (UV) wavelength range. For example, the semiconductor device may output light (UV-A) in a near UV wavelength range, output light (UV-B) in a far UV wavelength range, and output light (UV-C) in a deep UV wavelength range. The wavelength range may be determined by a composition ratio of aluminum (Al) of the semiconductor device.

For example, the light (UV-A) in a near UV wavelength range may have a wavelength in a range of 320 nm to 420 nm, the light (UV-B) in a far UV wavelength range may have a wavelength in a range of 280 nm to 320 nm, and the light (UV-C) in a deep UV wavelength range may have a wavelength in a range of 100 nm to 280 nm.

Referring to FIG. 1, a semiconductor device 100 according to the first embodiment of the present invention may include a light-emitting structure 110, a second electrode 122-1, and a reflective layer 142.

The light-emitting structure 110 may include a first conductive semiconductor layer 111, a second conductive semiconductor layer 112, and an active layer 113 disposed between the first conductive semiconductor layer 111 and the second conductive semiconductor layer 112.

The first conductive semiconductor layer 111 may be implemented with a compound semiconductor including a III-V group element, a II-VI group element, or the like and may be doped with a first dopant. The first conductive semiconductor layer 111 may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, GaN, AlGaN, InGaN, InAlGaN, and the like. Further, the first dopant may be an N-type dopant such as Si, Ge, Sn, Se, or Te. When the first dopant is an N-type dopant, the first conductive semiconductor layer 111 doped with the first dopant may be an N-type semiconductor layer.

The second conductive semiconductor layer 112 may be implemented with a compound semiconductor including a III-V group element, a II-VI group element, or the like and may be doped with a second dopant. The second conductive semiconductor layer 112 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or a material selected from the group consisting of AlInN, AlGaAs, GaP, GaAs, GaAsP, and AlGaInP. When the second dopant is a P-type dopant such as Mg, Zn, Ca, Sr, Ba, or the like, the second conductive semiconductor layer 112 doped with the second dopant may be a P-type semiconductor layer.

The active layer 113 may be disposed between the first conductive semiconductor layer 111 and the second conductive semiconductor layer 112. The active layer 113 is a layer into which electrons (or holes) injected from the first conductive semiconductor layer 111 and holes (or electrons) injected from the second conductive semiconductor layer 112 meet. In the active layer 113, as the electrons and the holes are recombined, the electrons may transition to a lower energy level and light having an UV wavelength may be generated.

The active layer 113 may have any one of a single well structure, a multi-well structure, a single quantum well (SQW) structure, a multiple quantum well (MQW) structure, a quantum dot structure, and a quantum wire structure, and the structure of the active layer 113 is not limited thereto.

The second electrode 122-1 may be in ohmic contact with the second conductive semiconductor layer 112. The second electrode 112 may include a transparent conductive oxide (TCO) film which absorbs a relatively small amount of UV light. The TCO film may be selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, and the like.

The reflective layer 142 may be electrically connected to the second electrode 122-1. The reflective layer 142 may be made of a material having high reflectance. The reflective layer 142 may include a first metal, for example, aluminum. The reflective layer 142 may reflect light emitted from the active layer 113. Further, the reflective layer 142 may inject a current into the second conductive semiconductor layer 112.

According to the embodiment, the second electrode 122-1 may be in direct contact with a semiconductor layer (e.g., a P-AlGaN layer) having an energy band gap greater than that of a wavelength of UV light. Conventionally, there is a problem in that the second electrode 122-1 is disposed in a semiconductor layer (e.g., a GaN layer) having a small band gap for ohmic contact so that most of UV light is absorbed in the GaN layer. However, since the second electrode 122-1 of the embodiment is in direct ohmic contact with a semiconductor layer (e.g., a P-AlGaN layer) having a large band gap, most of light may pass through the second conductive semiconductor layer 112-1.

For example, an Al composition of a surface layer of the second conductive semiconductor layer 112 in contact with the second electrode 122-1 may range from 1% to 10%. When the Al composition of the surface layer is less than 1%, light may be excessively absorbed, and when the Al composition of the surface layer is more than 10%, the ohmic property may be lowered.

The second electrode may absorb UV light. Therefore, it is necessary to improve light extraction efficiency while maintaining the ohmic contact by the second electrode. In order to improve the light extraction efficiency while maintaining the ohmic contact, a transmittance of the second electrode 122-1 may be increased and a conductive layer (a reflective layer) having a reflection characteristic may be disposed under the second electrode 122-1, and thus the light extraction efficiency may be improved.

Referring to FIG. 2, the second electrode 122-1 may include a first layer 122a and a second layer 122b. The second layer 122b may be disposed between the first layer 122a and the reflective layer 142. The second layer 122b may be a layer formed separately on the first layer 122a. Alternatively, the second layer 122b may be a layer formed from a region of the first layer 122a modified by doping or the like.

The first layer 122a may include a metal oxide. For example, the first layer 122a may be made of the TCO film (e.g., an ITO film) described above. The second layer 122b may include a metal oxynitride.

For example, the second layer 122b may be made of a compound (e.g., ITON) of the TCO film forming the first layer 122a and nitrogen. Therefore, the transmittance may be increased by the second layer 122b and an adhesive force between the first layer 122a and the reflective layer 142 may be improved.

An oxide (an oxide film) may be partially formed or may be formed as at least one layer between the second electrode 122-1 and the reflective layer 142 due to high temperature and high pressure that may occur during the process thereof. Since the resistance is increased between the second electrode 122-1 and the reflective layer 142 due to the oxide, current injection may not be smooth and electrical properties of the semiconductor device may be degraded. Further, the second electrode 122-1 and the reflective layer 142 may be delaminated due to the oxide.

In the embodiment, the second layer 122b containing a metal oxynitride may be disposed between the reflective layer 142 and the first layer 122a. In this case, in the second layer 122b, a bonding force of oxygen may be greater than a bonding force of nitrogen. This may be because the second layer 122b is a compound of nitrogen and a TCO film (e.g., in the case of ITO, a compound of indium oxide ($In_2O_3$) and tin oxide ($SnO_2$)) containing oxygen. That is, the TCO film itself may have a more stable bonding structure than the compound of the TCO film and the nitrogen. Accordingly, among the nitrogen and oxygen in the second layer 122b, an amount of the nitrogen which is larger than that of the oxygen may diffuse into the reflective layer 142 to form a compound partially or form a compound as at least one layer between the reflective layer 142 and the second layer 112b. Therefore, an intermediate portion 142a (see FIG. 3A) disposed between the first layer 122a and the reflective layer 142 may contain nitride having an amount more than that of the oxide.

As described above, the adhesive force between the first layer 122a and the reflective layer 142 may be improved due to the second layer 122b and the generation of oxides at an interface between the second layer 122b and the reflective layer 142 may be minimized.

A content ratio of nitrogen contained in the second layer 122b may be in a range of 0.33 to 1.5 times a content ratio of oxygen. When the content ratio of the nitrogen in the second layer 122b is less than 0.33 times the content ratio of the oxygen, an amount of oxide which is larger than that of the nitrogen may be formed between the second electrode 122-1 and the reflective layer 142, which may be undesirable. When the content ratio of the nitrogen in the second layer 122b is greater than 1.5 times the content ratio of the oxygen, the content ratio of the oxygen becomes relatively small so that a bonding force between elements constituting the second layer may be reduced. A ratio of nitrogen to oxygen may be calculated by analyzing secondary-ion mass spectrometry (SIMS) data, energy-dispersive x-ray spectroscopy (EDX) data, x-ray photoelectron spectroscopy (XPS) data, transmission electron microscope (TEM) data, etc., but the present invention is not limited thereto. Various analytical methods in which contents of constituent elements in a layer may be measured absolutely or relatively may be applied.

A thickness of the first layer 122a may range from 1 to 10 nm. When the thickness of the first layer 122a is greater than 10 nm, the transmittance may be lowered so that light loss may occur. Further, when the thickness of the first layer 122a is less than 1 nm, cracks may be easily generated due to an external impact and the resistance may be increased so that current injection efficiency may be lowered.

A thickness of the second layer 122b may range from 1 to 10 nm. When the thickness of the second layer 122b is greater than 10 nm, the transmittance may be lowered so that light loss may occur. Further, when the thickness of the second layer 122b is less than 1 nm, the adhesive force between the first layer 122a and the reflective layer 142 may be lowered and an anti-oxidizing effect may be reduced.

That is, the thickness of the second layer 122b may be in a range of 0.1 to 10 times the thickness of the first layer 122a. When the thickness of the second layer 122b is less than 0.1 times the thickness of the first layer 122a, the adhesive force between the first layer 122a and the reflective layer 142 may be lowered and the anti-oxidizing effect may be reduced. When the thickness of the second layer 122b is greater than 10 times the thickness of the first layer 122a, the transmittance may be lowered so that light loss may occur.

Figure 3A:
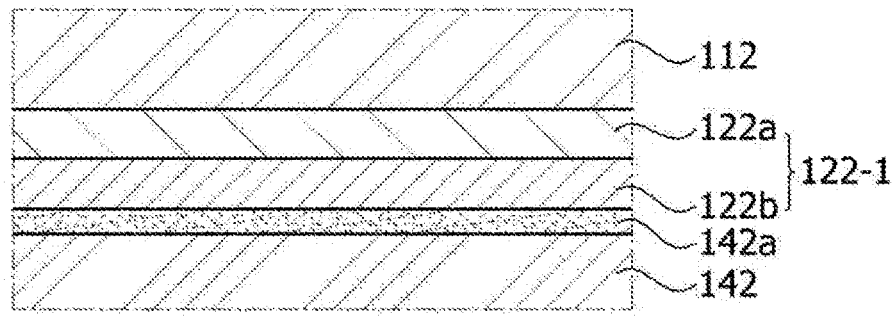
FIG. 3A shows a first modified example of FIG. 2.
Figure 3B:
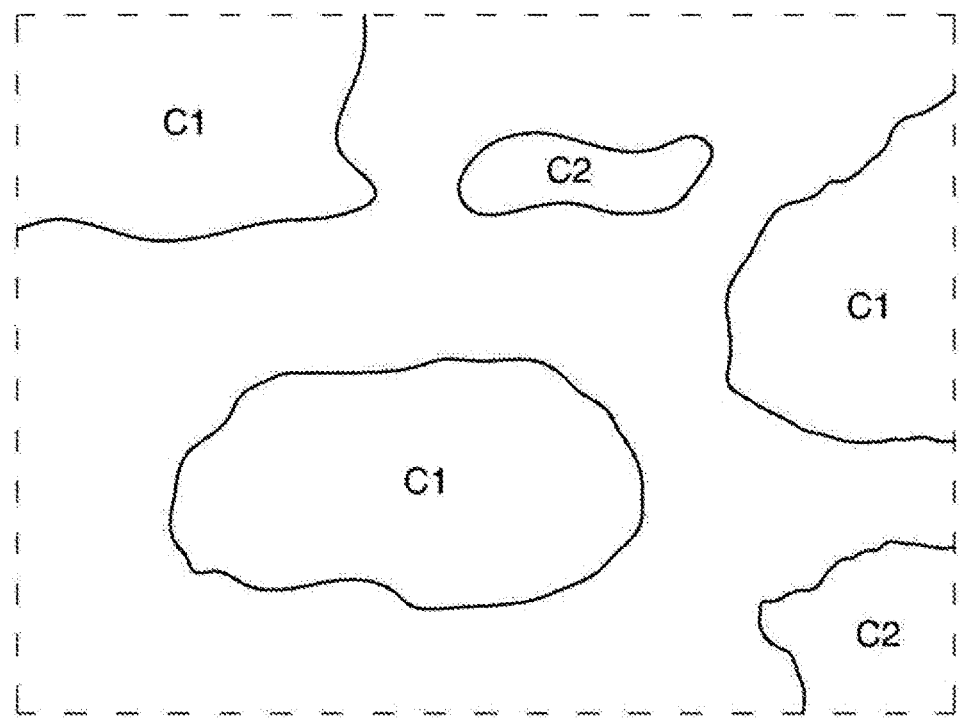
FIG. 3B is a plan view showing an example of a portion of an interface between a second layer and a reflective layer of FIG. 3A.

FIG. 3A shows a first modified example of FIG. 2, and FIG. 3B is a plan view showing an example of a portion of an interface between a second layer and a reflective layer of FIG. 3A.

Referring to FIG. 3A, the intermediate portion 142a may be further disposed between the second layer 122b and the reflective layer 142. The intermediate portion 142a may be formed by reacting respective materials included in the second layer 122b and the reflective layer 142 at the interface between the second layer 122b and the reflective layer 142. The intermediate portion 142a may be disposed in the form of a layer in an entire region between the second layer 122b and the reflective layer 142. The intermediate portion 142a may serve to improve an adhesive force between the second layer 122b and the reflective layer 142. Further, formation of an oxide between the second layer 122b and the reflective layer 142 may be minimized due to the formation of the intermediate portion 142a.

Referring to FIG. 3B, the intermediate portion 142a may include nitrides C1 of the first metal contained in the reflective layer 142. Further, the intermediate portion 142a may include oxides C2 of the first metal contained in the reflective layer 142. Specifically, the intermediate portion 142a may include a nitrogen compound (e.g., AlN) formed by the first metal (e.g., Al) contained in the reflective layer 142 and the nitrogen in the second layer 122b. Further, the intermediate portion 142a may include an oxygen compound (e.g., $Al_xO_y$) formed by the first metal (e.g., Al) contained in the reflective layer 142 and the oxygen in the second layer 122b. Further, the intermediate portion 142a may also include a compound other than the nitride of the first metal and the oxide of the first metal.

A content ratio of the nitrides C1 of the intermediate portion 142a may be greater than a content ratio of the oxides C2. That is, among nitrogen and oxygen in the second layer 122b, the diffusivity of the nitrogen into the reflective layer 142 is higher than that of the oxygen. When the intermediate portion 142a contains a larger amount of the oxides C2 than the nitrides C1, the adhesive force and electrical properties between the second layer 122b and the reflective layer 142 are degraded, which is undesirable.

A ratio of the nitrides C1 to the oxides C2 may be 2.3:1 or more. When the content of the nitrides C1 are less than 2.3 times the content of the oxides C2, the content ratio of the oxides C2 may become relatively large so that the second layer 122b and the reflective layer 142 may be delaminated, or the resistance may be increased so that current injection efficiency may be lowered.

FIG. 3B shows a result of observing the interface between the second layer 122b and the reflective layer 142 using a TEM or the like. That is, when a region between the second layer 122b and the reflective layer 142 is cut and observed using the TEM, the ratio of the nitrides C1 to the oxides C2 observed may be 2.3:1 or more per specific unit area. Further, when the semiconductor device 100 is cut in a longitudinal direction (a direction from top to bottom in FIG. 1), a length ratio of the nitrides C1 to the oxides C2 in contact with the reflective layer 142 or the second layer 122b may be 2.3:1 or more.

Meanwhile, in FIG. 3B, only a portion of the intermediate portion 142a is shown as being composed of the nitrides C1 and the oxides C2, but the present invention is not limited thereto. That is, an entirety of the intermediate portion 142a may be composed of nitrides or oxides.

Figure 3C:
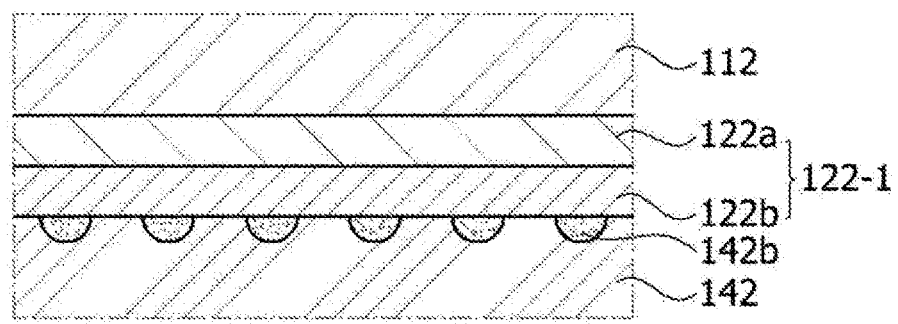
FIGS. 3C and 4 show a second modified example and a third modified example of FIG. 2.

FIG. 3C shows a second modified example of FIG. 2.

Referring to FIG. 3C, intermediate portions 142b may be further included between the second layer 122b and the reflective layer 142. The intermediate portion 142b may be disposed in a part of a region between the second layer 122b and the reflective layer 142. The intermediate portion 142b may be disposed in the form of a cluster between the second layer 122b and the reflective layer 142. In the drawing, the intermediate portions 142b having the same size are shown, but the present invention is not limited thereto. The intermediate portion 142b may have the same configuration as shown in FIG. 3A except for its shape. Further, when the interface between the second layer 122b and the reflective layer 142 is observed, the intermediate portion 142b may be observed in a shape similar to that of FIG. 3B.

Figure 4:
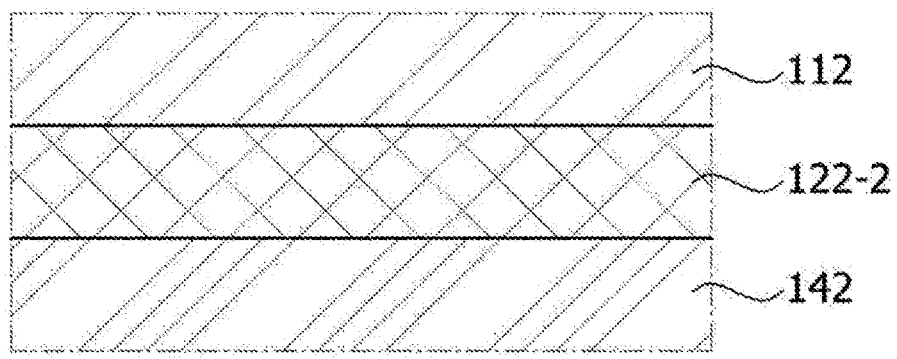

FIG. 4 shows a third modified example of FIG. 2.

Referring to FIG. 4, a second electrode 122-2 may be disposed between the second conductive semiconductor layer 112 and the reflective layer 142. The second electrode 122-2 may include a metal oxynitride. Specifically, the second electrode 122-2 may be made of a compound (e.g., ITON) of a TCO film and nitrogen. Although not shown, the intermediate portion 142a shown in FIG. 3A or the intermediate portion 142b shown in FIG. 3C may be disposed between the second electrode 122-2 and the reflective layer 142. Further, when an interface between the second electrode 122-2 and the reflective layer 142 is observed, the intermediate portions 142a and 142b may be observed in a shape similar to that of FIG. 3B.

Figure 5:
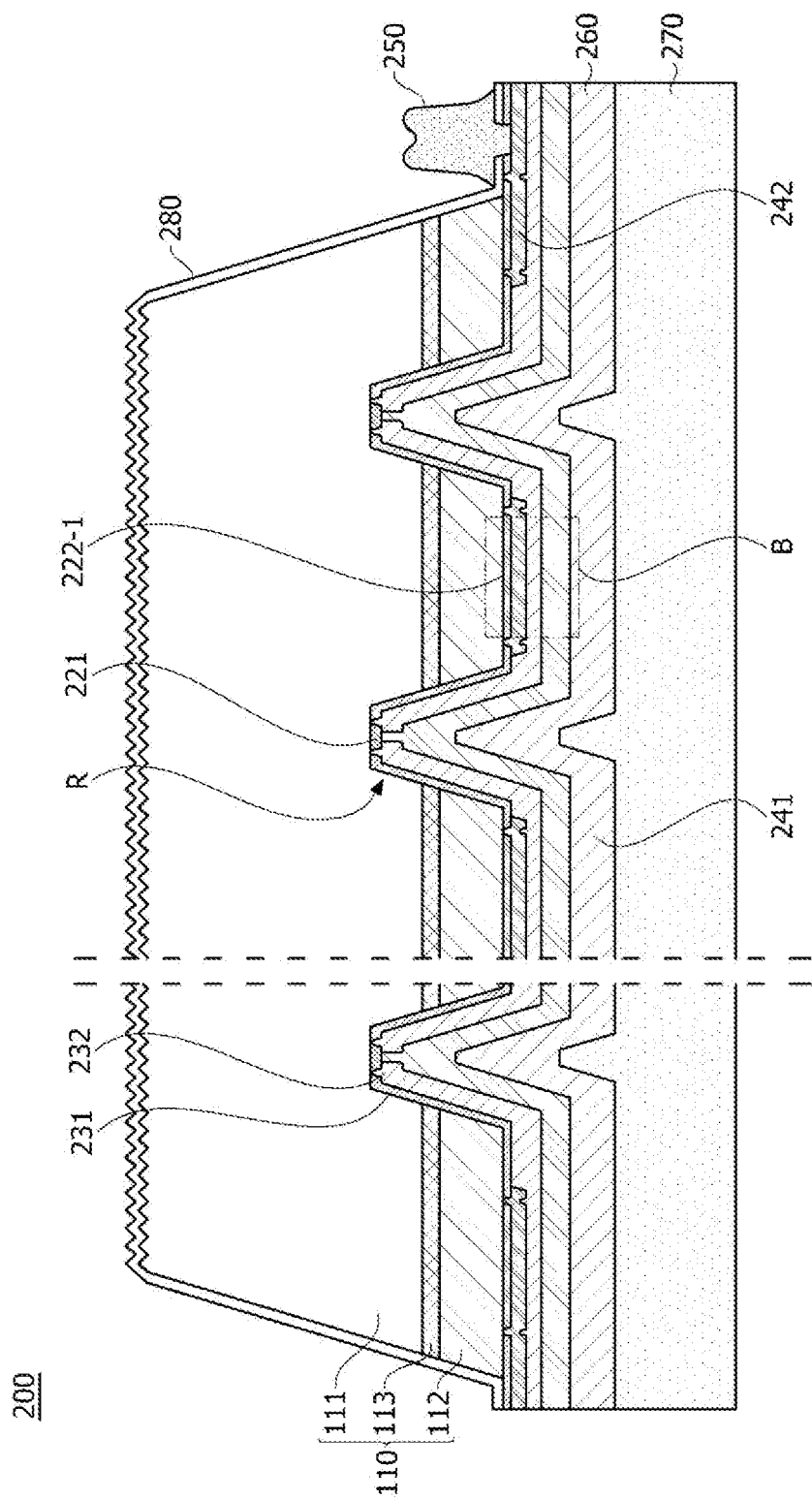
FIG. 5 is a conceptual diagram of a semiconductor device according to a second embodiment of the present invention.
Figure 6:
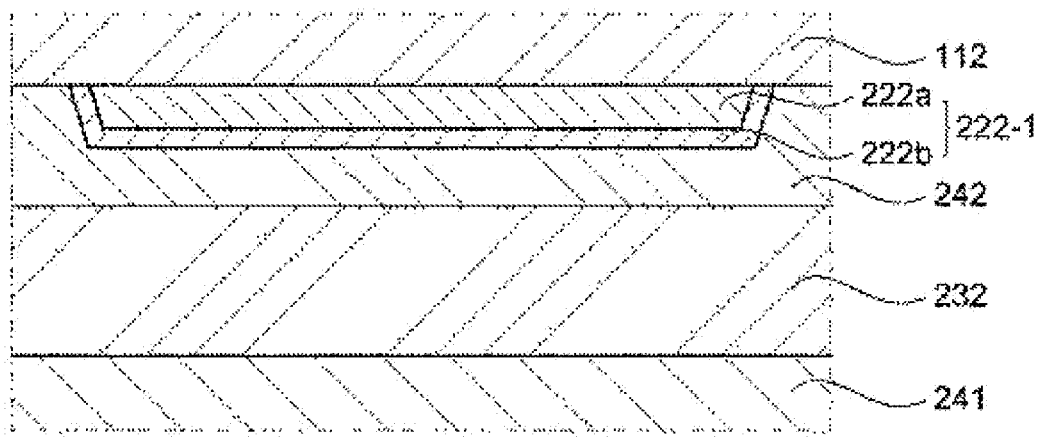
FIG. 6 is an enlarged view of a portion B of FIG. 5.

FIG. 5 is a conceptual diagram of a semiconductor device according to a second embodiment of the present invention, and FIG. 6 is an enlarged view of a portion B of FIG. 5.

Referring to FIG. 5, a semiconductor device 200 according to the second embodiment of the present invention may include a light-emitting structure 110, a plurality of recesses R, first electrodes 221, second electrodes 222-1, and reflective layers 242.

The configuration of the light-emitting structure 110 shown in FIG. 1 may be applied without change to the light-emitting structure 110. Uneven portions may be formed on an upper surface of the light-emitting structure 110. The uneven portions may serve to improve extraction efficiency of light emitted from the light-emitting structure 110. The uneven portions may have different average heights according to UV wavelengths. UV-C may have a height in the range of about 300 nm to 800 nm, and light extraction efficiency may be improved when an average height thereof ranges from about 500 nm to 600 nm.

The plurality of recesses R may pass through an active layer 113 and be disposed from a first surface of a second conductive semiconductor layer 112 to a part of a region of a first conductive semiconductor layer 111. A first insulating layer 231 and a second insulating layer 232 may be disposed in the recess R so that a first conductive layer 241 may be electrically insulated from the second conductive semiconductor layer 112 and the active layer 113.

The first electrode 221 may be disposed on an upper surface of the recess R and electrically connected to the first conductive semiconductor layer 111. The first electrode 221 may be exposed through the first insulating layer 231 and electrically connected to the first conductive semiconductor layer 111. The first electrode 221 is electrically insulated from the active layer 113 and the second conductive semiconductor layer 112 by the first insulating layer 231. The first electrode 221 may be an ohmic electrode.

The first electrode 221 may include at least one of ITO, IZO, IZTO, IAZO, IGZO, IGTO, AZO, ATO, GZO, IZON, AGZO, IGZO, ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited thereto.

The second electrode 222-1 may be formed on the second conductive semiconductor layer 112. The second electrode 222-1 is exposed through the first insulating layer 231 and electrically connected to the second conductive semiconductor layer 112. The second electrode 222-1 may be an ohmic electrode.

The second electrode 222-1 may include a TCO film which absorbs a relatively small amount of UV light. The TCO film may be selected from ITO, IZO, AZO, AGZO, IZTO, IAZO, IGZO, IGTO, ATO, GZO, IZON, ZnO, $IrO_x$, $RuO_x$, NiO, and the like.

The first insulating layer 231 and the second insulating layer 232 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but the present invention is not limited thereto. The first insulating layer 231 and the second insulating layer 232 may be formed as a single layer or a multilayer. For example, the first and second insulating layers 231 and 232 may be a distributed Bragg reflector (DBR) having a multilayer structure including Si oxide or a Ti compound. However, the present invention is not limited thereto, and the first and second insulating layers 231 and 232 may have various reflective structures.

When the first and second insulating layers 231 and 232 perform a reflection function, the first and second insulating layers 231 and 232 may reflect light, which is emitted from the active layer 113 toward a side surface thereof, upward so that the light extraction efficiency may be improved. As the number of recesses R increases, an UV semiconductor device may have further improved light extraction efficiency than a semiconductor device which emits blue light.

The first conductive layer 241 may be disposed along a shape of a lower surface of the light-emitting structure 110 and shapes of the recesses R. The first conductive layer 241 is electrically insulated from the second conductive layer (the reflective layer) 242 by the second insulating layer 232. The first conductive layer 241 may pass through the second insulating layer 232 and may be electrically connected to the first electrode 221.

The first conductive layer 241 may be made of a material having high reflectance. For example, the first conductive layer 241 may include aluminum. When the first conductive layer 241 includes aluminum, the first conductive layer 241 may serve to reflect the light emitted from the active layer 113 upward so that the light extraction efficiency may be improved.

The second conductive layer (hereinafter, referred to as a reflective layer) 242 may be disposed to cover the second electrode 222-1. The reflective layer 242 may be in contact with side surfaces and a lower surface of the first insulating layer 231. When the reflective layer 242 is in contact with the side surfaces and the lower surface of the first insulating layer 231, the thermal and electrical reliability of the second electrode 222-1 may be improved. The reflective layer 242 may be made of a material having a good adhesive force with respect to the first insulating layer 231.

Further, the reflective layer 242 may be made of a material having high reflectance. The reflective layer 242 may include a first metal, for example, aluminum. When the reflective layer 242 includes aluminum, the reflective layer 242 may reflect the light emitted from the active layer 113 upward. Further, the reflective layer 242 may reflect light emitted between the first insulating layer 231 and the second electrode 222-1 upward so that the light extraction efficiency may be improved.

Meanwhile, a second electrode pad 250 may be disposed at one corner of the semiconductor device 200. The second electrode pad 250 may pass through the first insulating layer 231 and be electrically connected to the reflective layer 242 and the second electrode 222-1. That is, the second electrode pad 250, the reflective layer 242, and the second electrode 222-1 may form one electrical channel. Further, the second electrode pad 250 is electrically insulated from the first conductive layer 241 by the second insulating layer 232.

The second electrode pad 250 may have a recessed central portion and an upper surface thereof may have a concave portion and a convex portion. A wire (not shown) may be bonded to the concave portion of the second electrode pad 250. Therefore, a bonding area may be widened and the second electrode pad 250 and the wire may be more firmly bonded.

The second electrode pad 250 may reflect light. Therefore, the light extraction efficiency of the semiconductor device 200 may be improved as the second electrode pad 250 becomes closer to the light-emitting structure 110. Further, a height of the convex portion of the second electrode pad 250 may be greater than that of the active layer 113. Therefore, the second electrode pad 250 may reflect light, which is emitted from the active layer 113 in a horizontal direction of the device, upward, and thus the light extraction efficiency may be improved and an orientation angle of the light may be controlled.

A bonding layer 260 may be further disposed along the shape of the lower surface of the light-emitting structure 110 and the shapes of the recesses 128. The bonding layer 260 may be formed on the first conductive layer 241. The bonding layer 260 may include a conductive material. For example, the bonding layer 260 may include a material selected from the group consisting of gold, tin, indium, aluminum, silicon, silver, nickel, and copper, or an alloy thereof.

A substrate 270 may be disposed on the bonding layer 260. The substrate 270 may be made of a conductive material. For example, the substrate 270 may include a metal or a semiconductor material. Further, the substrate 270 may be a metal having high electrical conductivity and/or thermal conductivity. For example, the substrate 270 may include a material selected from the group consisting of silicon, molybdenum, silicon, tungsten, copper, and aluminum, or an alloy thereof. In this case, heat generated during operation of the semiconductor device may be quickly discharged to the outside.

A passivation layer 280 may be formed on an upper surface and side surfaces of the light-emitting structure 110. The passivation layer 280 may be in contact with the first insulating layer 231 at a region adjacent to the second electrode 222-1.

Referring to FIG. 6, the second electrode 222-1 may include a first layer 222a and a second layer 222b. The second layer 222b is disposed between the first layer 222a and the reflective layer 242. The second layer 222b may be a layer formed separately on the first layer 222a. Alternatively, the second layer 222b may be a layer formed from a region of the first layer 222a modified by doping or the like.

The first layer 222a may include a metal oxide. For example, the first layer 222a may be made of the TCO film described above (e.g., ITO). The second layer 222b may include a metal oxynitride. For example, the second layer 222b may be made of a compound (e.g., ITON) of the TCO film forming the first layer 222a and nitrogen. Therefore, the transmittance may be increased by the second layer 222b and an adhesive force between the first layer 222a and the reflective layer 242 may be improved.

A content ratio of nitrogen contained in the second layer 222b may be 0.33 to 1.5 times a content ratio of oxygen. When the content ratio of the nitrogen in the second layer 122b is less than 0.33 times the content ratio of the oxygen, an amount of oxide which is larger than that of nitrogen may be formed between the second electrode 122-1 and the reflective layer 142, which is undesirable. When the content ratio of the nitrogen in the second layer 122b is greater than 1.5 times the content ratio of the oxygen, the content ratio of the oxygen becomes relatively small so that a bonding force between elements constituting the second layer may be reduced.

A thickness of the first layer 222a may range from 1 to 10 nm. When the thickness of the first layer 222a is greater than 10 nm, the transmittance may be lowered so that light loss may occur, which is undesirable. Further, when the thickness of the first layer 222a is less than 1 nm, cracks may easily generated due to an external impact and the resistance may be increased so that current injection efficiency may be lowered, which is undesirable.

A thickness of the second layer 222b may range from 1 to 10 nm. When the thickness of the second layer 222b is greater than 10 nm, the transmittance may be lowered so that light loss may occur, which is undesirable. Further, when the thickness of the second layer 222b is less than 1 nm, the adhesive force between the first layer 222a and the reflective layer 242 may be lowered and the anti-oxidizing effect may be reduced, which is undesirable.

That is, the thickness of the second layer 222b may be 0.1 to 10 times the thickness of the first layer 222a. When the thickness of the second layer 222b is less than 0.1 times the thickness of the first layer 222a, the adhesive force between the first layer 222a and the reflective layer 242 may be lowered and the anti-oxidizing effect may be reduced, which is undesirable. When the thickness of the second layer 222b is greater than 10 times the thickness of the first layer 222a, the transmittance may be lowered so that light loss may occur, which is undesirable.

Figure 7A:
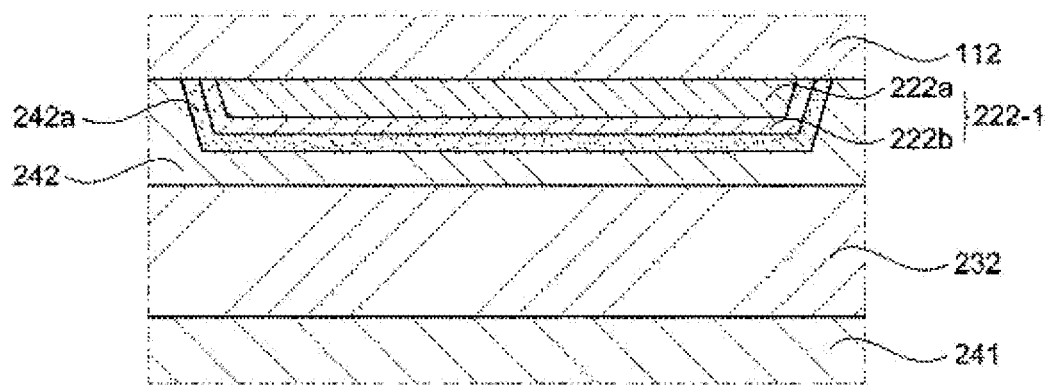
FIGS. 7A, 7B, and 8 show a first modified example, a second modified example, and a third modified example of FIG. 6, respectively.
Figure 7B:
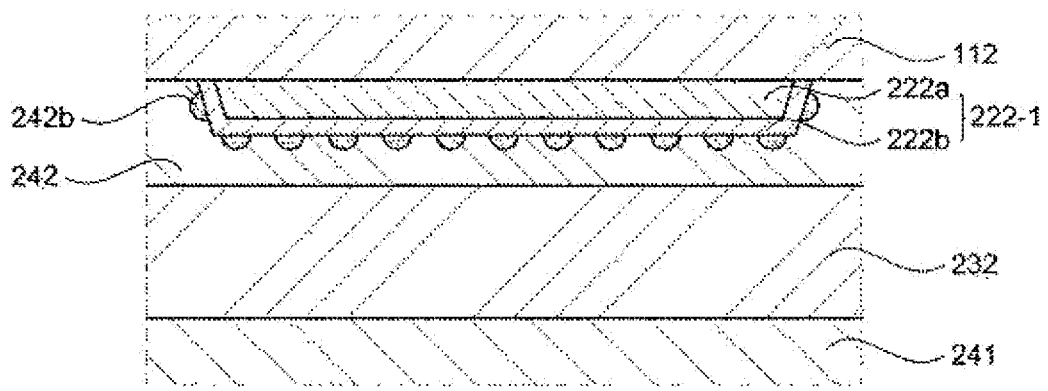

FIG. 7A shows a first modified example of FIG. 6, and FIG. 7B shows a second modified example of FIG. 6.

Referring to FIG. 7A, an intermediate portion 242a may be further included between the second layer 222b and the reflective layer 242. The intermediate portion 242a may be disposed in the form of a layer in an entire region between the second layer 222b and the reflective layer 242. The intermediate portion 242a may serve to improve an adhesive force between the second layer 222b and the reflective layer 242. Further, formation of an oxide between the second layer 222b and the reflective layer 242 may be minimized due to the formation of the intermediate portion 242a.

The intermediate portion 242a may be formed by reacting respective materials included in the second layer 222b and the reflective layer 242 at an interface between the second layer 222b and the reflective layer 242. The intermediate portion 242a may include a nitride of a first metal contained in the reflective layer 242. Further, the intermediate portion 242a may include an oxide of the first metal contained in the reflective layer 242. The nitride and the oxide may be composed similar to those of FIG. 3B described above.

Specifically, the intermediate portion 242a may include a nitrogen compound (e.g., AlN) formed by the first metal (e.g., Al) contained in the reflective layer 242 and the nitrogen in the second layer 222b. Further, the intermediate portion 242a may include an oxygen compound (e.g., $Al_xO_y$) formed by the first metal (e.g., Al) contained in the reflective layer 242 and the oxygen in the second layer 222b. Further, the intermediate portion 242a may also include a compound other than the nitride of the first metal and the oxide of the first metal.

A ratio of nitride to oxide may be 2.3:1 or more. When the ratio of the nitride to the oxide is less than 2.3:1, a content ratio of the oxide may become relatively large so that the second layer 122b and the reflective layer 142 may be delaminated, or the resistance may be increased so that current injection efficiency may be lowered.

Referring to FIG. 7B, an intermediate portion 242b may be further included between the second layer 222b and the reflective layer 242. The intermediate portion 242b may be disposed in a part of a region between the second layer 222b and the reflective layer 242. The intermediate portion 242b may be disposed in the form of a cluster between the second layer 222b and the reflective layer 242. The intermediate portion 242b may have the same configuration as the intermediate portion 242a of FIG. 7A except for its shape.

Figure 8:
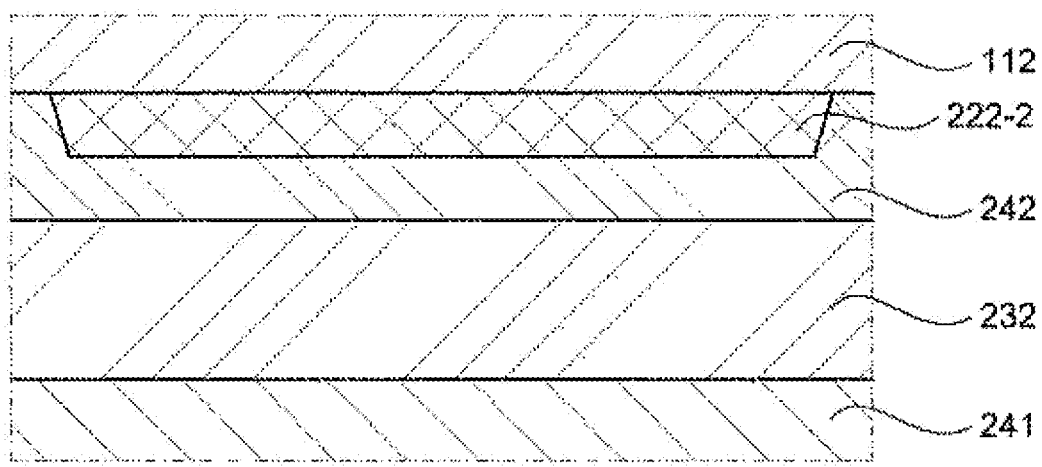

FIG. 8 shows a third modified example of FIG. 6.

Referring to FIG. 8, a second electrode 222-2 may be disposed between the second conductive semiconductor layer 212 and the reflective layer 242. The second electrode 222-2 may include a metal oxynitride. Specifically, the second electrode 222-2 may be made of a compound of a TCO film and nitrogen (e.g., ITON). Although not shown, the intermediate portion 242a shown in FIG. 7A or the intermediate portion 242b shown in FIG. 7B may be disposed between the second electrode 222-2 and the reflective layer 242.

Figure 9:
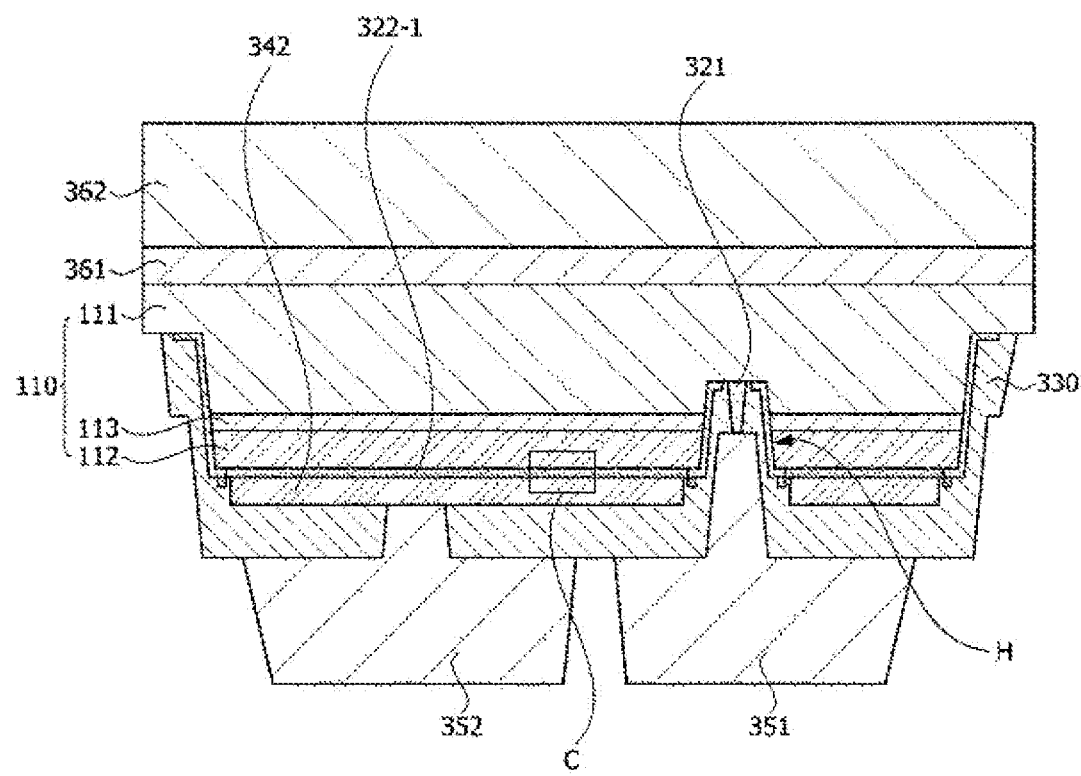
FIG. 9 is a conceptual diagram of a semiconductor device according to a third embodiment of the present invention.
Figure 10:
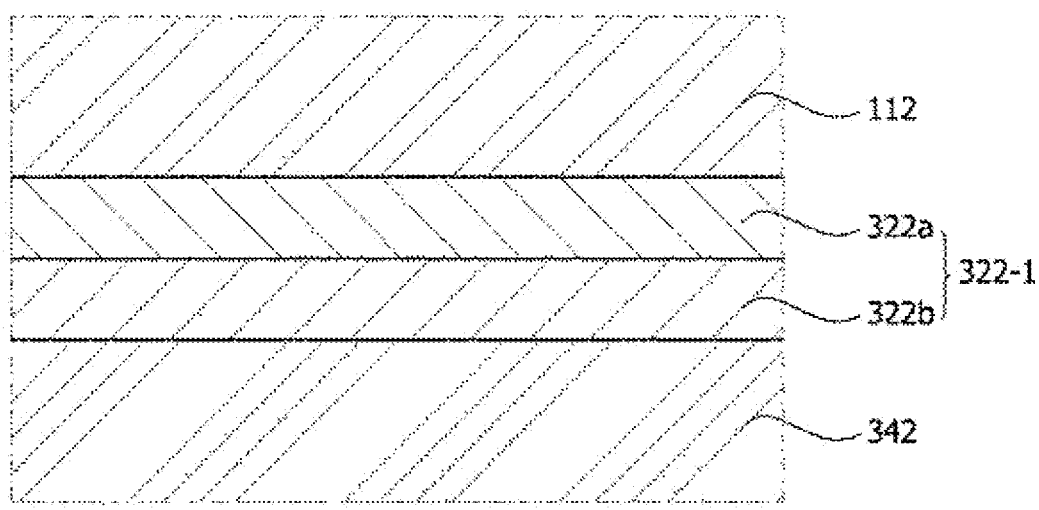
FIG. 10 is an enlarged view of a portion C of FIG. 9.

FIG. 9 is a conceptual diagram of a semiconductor device according to a third embodiment of the present invention, and FIG. 10 is an enlarged view of a portion C of FIG. 9.

Referring to FIG. 9, a semiconductor device 300 according to the third embodiment of the present invention may include a light-emitting structure 110, a first electrode 321, a second electrode 322-1, and a reflective layer 342.

The configuration of the light-emitting structure 110 shown in FIG. 1 may be applied without change to the light-emitting structure 110. The light-emitting structure 110 may include at least one groove H.

The first electrode 321 is electrically connected to a first conductive semiconductor layer 111. The first electrode 321 may be disposed to pass through a region of the light-emitting structure 110. Further, the first electrode 321 may be disposed to a part of a region of the first conductive semiconductor layer 111. Further, the first electrode 321 may be disposed inside the groove H. In this case, the first electrode 321 is electrically insulated from a second conductive semiconductor layer 112 and the active layer 113 by an insulating layer 330. The first electrode 321 may be an ohmic electrode.

The first electrode 321 may include at least one of ITO, IZO, IZTO, IAZO, IGZO, IGTO, AZO, ATO, GZO, IZON, AGZO, IGZO, ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited thereto.

The second electrode 322-1 is electrically connected to the second conductive semiconductor layer 112. The second electrode 322-1 may be disposed on the second conductive semiconductor layer 112. The second electrode 322-1 may be an ohmic electrode.

The second electrode 322-1 may include a TCO film which absorbs a relatively small amount of UV light. The TCO film may be selected from ITO, IZO, AZO, AGZO, IZTO, IAZO, IGZO, IGTO, ATO, GZO, IZON, ZnO, $IrO_x$, $RuO_x$, NiO, and the like.

The insulating layer 330 may be formed on the light-emitting structure 110. The insulating layer 330 may be disposed on a side wall of the groove H formed in the light-emitting structure 110. Further, a part of a region of the reflective layer 342 may be exposed through the insulating layer 330. The insulating layer 330 may serve as a reflective layer.

The insulating layer 330 may be made of at least one selected from the group consisting of $SiO_2$, $Si_xO_y$, $Si_3N_4$, $Si_xN_y$, $SiO_xN_y$, $Al_2O_3$, $TiO_2$, AN, and the like, but the present invention is not limited thereto. The insulating layer 330 may be formed as a single layer or a multilayer. For example, the insulating layer 330 may be a DBR having a multilayer structure including Si oxide or a Ti compound. However, the present invention is not limited thereto, and the insulating layer 330 may include various reflective structures.

The reflective layer 342 is electrically connected to the second electrode 322-1. A part of the region of the reflective layer 342 may be exposed through the insulating layer 330. The reflective layer 342 may be made of a material having high reflectance. The reflective layer 342 may include a first metal, for example, aluminum. When the reflective layer 342 includes aluminum, the reflective layer 342 may reflect light emitted from the active layer 113 upward.

A first external electrode 351 is electrically connected to the first electrode 321. The first external electrode 351 may extend from the groove H of the light-emitting structure 100 to an outer side of the insulating layer 330. The first external electrode 351 is electrically insulated from the second conductive semiconductor layer 112 and the active layer 113 by the insulating layer 330.

A second external electrode 352 is electrically connected to the reflective layer 342. The second external electrode 352 may be disposed in at least a part of the region of the reflective layer 342. The second external electrode 352 may be disposed in the region of the reflective layer 342, which is exposed through the insulating layer 330.

An optical layer 361 may be disposed on the light-emitting structure 110. The optical layer 361 is disposed to cover the first electrode 321. The optical layer 361 may bond the light-emitting structure 110 to a light transmitting substrate 362. The optical layer 361 may be a resin such as polycarbonates (PC) or poly-methyl-methacrylate (PMMA) and may be an optical clear adhesive (OCA). However, a material of the optical layer 361 is not limited to the above materials.

The light transmitting substrate 362 may be an insulating substrate. The light transmitting substrate 362 may be formed of a material selected from the group consisting of sapphire ($Al_2O_3$), SiC, GaN, ZnO, Si, GaP, InP, and Ge. However, a material of the light transmitting substrate 362 is not limited to the above materials. A plurality of uneven portions may be formed on the light transmitting substrate 362. The uneven portions may serve to improve light extraction efficiency.

Referring to FIG. 10, the second electrode 322-1 may include a first layer 322a and a second layer 322b. The second layer 322b may be disposed between the first layer 322a and the reflective layer 342. The second layer 322b may be a layer formed separately on the first layer 322a. Alternatively, the second layer 322b may be a layer formed from a region of the first layer 322a modified by doping or the like.

The first layer 322a may include a metal oxide. For example, the first layer 322a may be made of the TCO film (e.g., an ITO film) described above. The second layer 322b may include a metal oxynitride. For example, the second layer 322b may be made of a compound (e.g., ITON) of the TCO film forming the first layer 322a and nitrogen. Therefore, the transmittance may be increased by the second layer 322b and an adhesive force between the first layer 322a and the reflective layer 342 may be improved.

A content ratio of nitrogen contained in the second layer 322b may be in a range of 0.33 to 1.5 times a content ratio of oxygen. When the content ratio of the nitrogen in the second layer 322b is less than 0.33 times the content ratio of the oxygen, an amount of oxide which is larger than that of nitrogen may be formed between the second electrode 322-1 and the reflective layer 342, which is undesirable. When the content ratio of the nitrogen in the second layer 322b is greater than 1.5 times the content ratio of the oxygen, the content ratio of the oxygen becomes relatively small so that a bonding force between elements constituting the second layer may be reduced.

A thickness of the first layer 322a may range from 1 to 10 nm. When the thickness of the first layer 322a is greater than 10 nm, the transmittance may be lowered so that light loss may occur, which is undesirable. Further, when the thickness of the first layer 322a is less than 1 nm, cracks may easily generated due to an external impact and the resistance may be increased so that current injection efficiency may be lowered, which is undesirable.

A thickness of the second layer 322b may range from 1 to 10 nm. When the thickness of the second layer 322b is greater than 10 nm, the transmittance may be lowered so that light loss may occur, which is undesirable. Further, when the thickness of the second layer 322b is less than 1 nm, the adhesive force between the first layer 322a and the reflective layer 342 may be lowered and the anti-oxidizing effect may be reduced, which is undesirable.

That is, the thickness of the second layer 322b may be in a range of 0.1 to 10 times the thickness of the first layer 322a. When the thickness of the second layer 322b is less than 0.1 times the thickness of the first layer 322a, the adhesive force between the first layer 322a and the reflective layer 342 may be lowered and the anti-oxidizing effect may be reduced, which is undesirable. When the thickness of the second layer 322b is greater than 10 times the thickness of the first layer 322a, the transmittance may be lowered so that light loss may occur, which is undesirable.

Figure 11A:
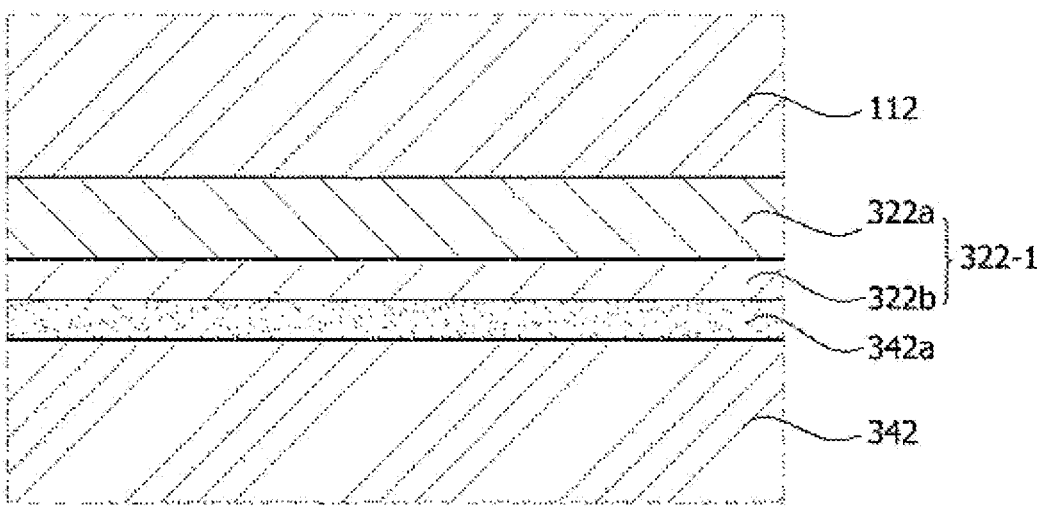
FIGS. 11A, 11B, and 12 show a first modified example, a second modified example, and a third modified example of FIG. 10, respectively.
Figure 11B:
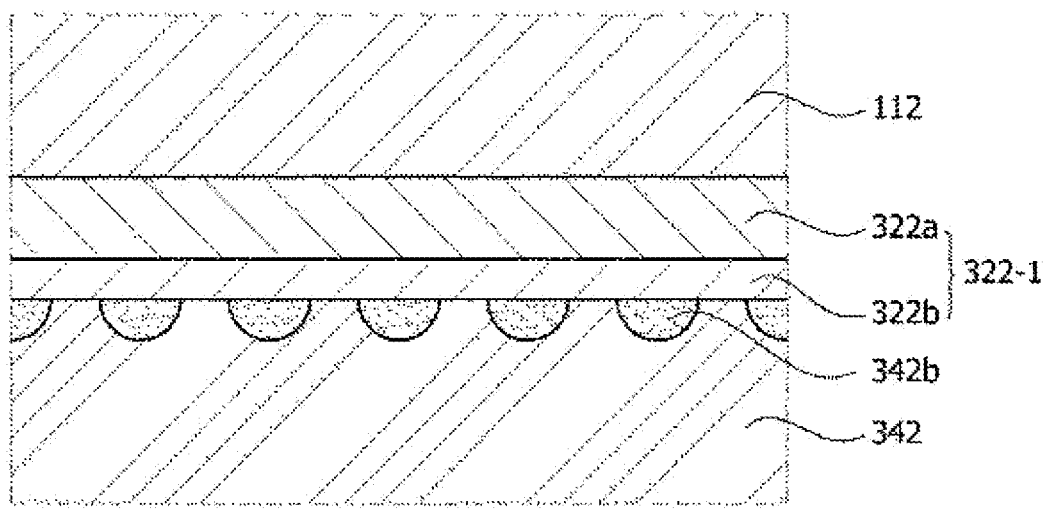

FIG. 11A shows a first modified example of FIG. 10 and FIG. 11B shows a second modified example of FIG. 10.

Referring to FIG. 11A, an intermediate portion 342a may be further included between the second layer 322b and the reflective layer 342. The intermediate portion 342a may be disposed in the form of a layer in an entire region between the second layer 322b and the reflective layer 342. The intermediate portion 342a may serve to improve an adhesive force between the second layer 322b and the reflective layer 342. Further, formation of an oxide between the second layer 322b and the reflective layer 342 may be minimized due to the formation of the intermediate portion 342a.

The intermediate portion 342a may be formed by reacting respective materials included in the second layer 322b and the reflective layer 342 at an interface between the second layer 322b and the reflective layer 342. The intermediate portion 342a may include a nitride of a first metal contained in the reflective layer 342. Further, the intermediate portion 342a may include an oxide of the first metal contained in the reflective layer 342. The nitride and the oxide may be composed similar to those of FIG. 3B described above.

Specifically, the intermediate portion 342a may include a nitrogen compound (e.g., AlN) formed by the first metal (e.g., Al) contained in the reflective layer 342 and the nitrogen in the second layer 322b. Alternatively, the intermediate portion 342a may include an oxygen compound (e.g., $Al_xO_y$) formed by the first metal (e.g., Al) contained in the reflective layer 342 and the oxygen in the second layer 322b. Further, the intermediate portion 342a may also include a compound other than the nitride of the first metal and the oxide of the first metal.

A ratio of nitride to oxide may be 2.3:1 or more. When the ratio of nitride to the oxide is less than 2.3:1, a content ratio of oxide may become relatively large so that the second layer 322b and the reflective layer 342 may be delaminated, or the resistance may be increased so that current injection efficiency may be lowered.

Referring to FIG. 11B, an intermediate portion 342b may be further included between the second layer 322b and the reflective layer 342. The intermediate portion 342b may be disposed in a part of a region between the second layer 322b and the reflective layer 342. The intermediate portion 342b may be disposed in the form of a cluster between the second layer 322b and the reflective layer 342. The intermediate portion 342b may have the same configuration as the intermediate portion 342a of FIG. 11A except for its shape.

Figure 12:
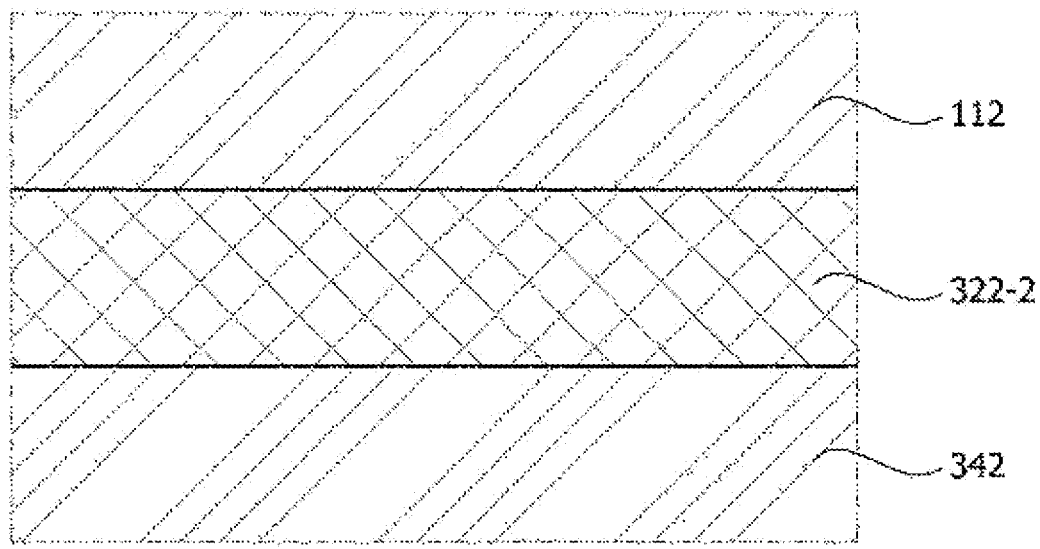

FIG. 12 shows a third modified example of FIG. 10.

Referring to FIG. 12, a second electrode 322-2 may be disposed between the second conductive semiconductor layer 312 and the reflective layer 342. The second electrode 322-2 may include a metal oxynitride. Specifically, the second electrode 322-2 may be made of a compound (e.g., ITON) of a TCO film and nitrogen. Although not shown, the intermediate portion 342a shown in FIG. 11A or the intermediate portion 342b shown in FIG. 11B may be disposed between the second electrode 322-2 and the reflective layer 342.

Figure 13:
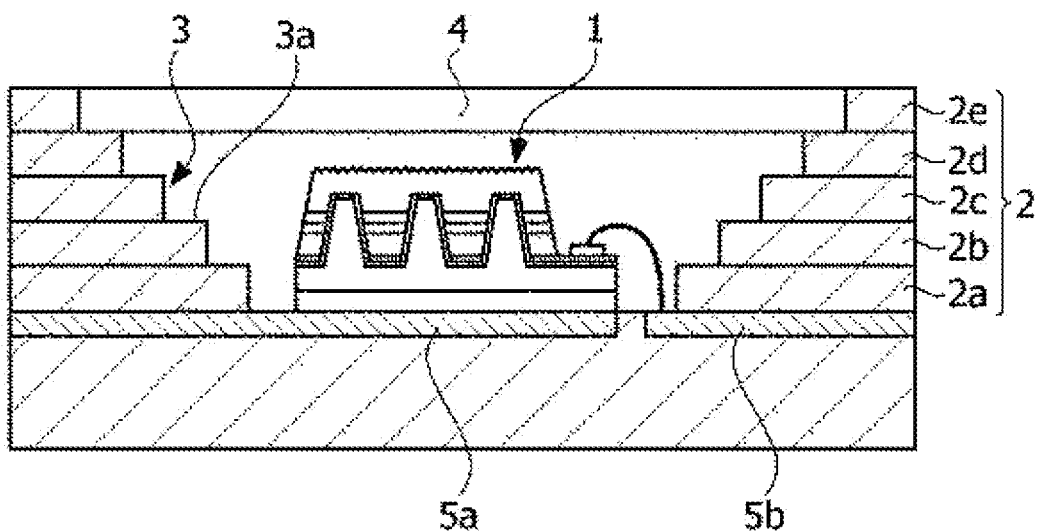
FIG. 13 is a conceptual diagram of a semiconductor device package according to an embodiment of the present invention.

FIG. 13 is a conceptual diagram of a semiconductor device package according to an embodiment of the present invention.

A semiconductor device may be configured as a package and may be used for a resin or a resist, or for curing spin-on dielectrics (SOD) or spin-on glass (SOG). Alternatively, the semiconductor device may be used for medical treatment or medical usage or may be used for sterilizing air purifiers, water purifiers, or the like.

Referring to FIG. 13, the semiconductor device package may include a body 2 having a groove 3 formed therein, a semiconductor device 1 disposed in the body 2, and a pair of lead frames 5a and 5b which are disposed on the body 2 and electrically connected to the semiconductor device 1. The semiconductor device 1 may include all of the configurations described above.

The body 2 may include a material or a coating layer that reflects UV light. The body 2 may be formed by stacking a plurality of layers 2a, 2b, 2c, 2d, and 2e. The plurality of layers 2a, 2b, 2c, 2d, and 2e may include the same material or may include different materials.

The groove 3 may be formed to be wider as going up from the semiconductor device, and steps 3a may be formed on an inclined surface of the groove 3.

A light transmitting layer 4 may cover the groove 3. The light transmitting layer 4 may be made of glass, but the present invention is not limited thereto. The light transmitting layer 4 may be made of a material as long as it can effectively transmit UV light without particular limitation. An inside of the groove 3 may be an empty space.

FIGS. 14 to 20B are cross-sectional views sequentially showing a method of manufacturing a semiconductor device according to an embodiment of the present invention.

Referring to FIGS. 14 to 20B, a method of manufacturing a semiconductor device 100 according to the embodiment of the present invention may include forming a light-emitting structure 110 including a first conductive semiconductor layer 111, a second conductive semiconductor layer 112, and an active layer 113, forming an electrode 122, and forming a reflective layer 142.

Figure 14:
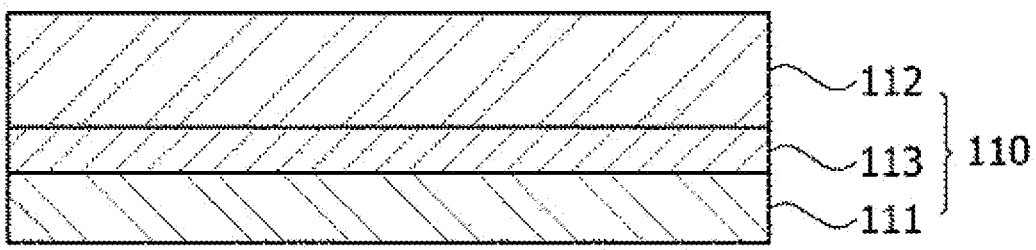
FIGS. 14 to 20B are cross-sectional views sequentially showing a method of manufacturing a semiconductor device according to an embodiment of the present invention.

First, referring to FIG. 14, an operation of forming the light-emitting structure 110 including the first conductive semiconductor layer 111, the second conductive semiconductor layer 112, and the active layer 113 may be performed. The light-emitting structure 110 may be formed by sequentially depositing the first conductive semiconductor layer 111, the active layer 113, and the second conductive semiconductor layer 112 on one surface of a substrate (not shown).

The substrate may be formed of a material selected from the group consisting of sapphire ($Al_2O_3$), SiC, GaAs, GaN, ZnO, Si, GaP, InP, and Ge, but the present invention is not limited thereto.

A buffer layer (not shown) may be further included between the substrate and the light-emitting structure 110.

The buffer layer may serve to reduce lattice mismatch between the substrate and the light-emitting structure 110 provided on the substrate.

The buffer layer may be a combination of a III group element and a V group element or may include any one of GaN, InN, AlN, InGaN, AlGaN, InAlGaN, and AlInN. The buffer layer may be doped with a dopant, but the present invention is not limited thereto.

The first conductive semiconductor layer 111 may be implemented with a compound semiconductor including a III-V group element, a II-VI group element, or the like, and may be doped with a first dopant. The first conductive semiconductor layer 111 may be selected from semiconductor materials having a composition formula of $In_{x1}Al_{y1}Ga_{1-x1-y1}N$ (0≤x1≤1, 0≤y1≤1, and 0≤x1+y1≤1), for example, GaN, AlGaN, InGaN, InAlGaN, and the like. Further, the first dopant may be an N-type dopant such as Si, Ge, Sn, Se, or Te. When the first dopant is an N-type dopant, the first conductive semiconductor layer 111 doped with the first dopant may be an N-type semiconductor layer.

The active layer 113 may have any one of a single well structure, a multi-well structure, a SQW structure, a MQW structure, a quantum dot structure, and a quantum wire structure, and the structure of the active layer 113 is not limited thereto.

The second conductive semiconductor layer 112 may be implemented with a compound semiconductor including a III-V group element, a II-VI group element, or the like, and may be doped with a second dopant. The second conductive semiconductor layer 112 may be formed of a semiconductor material having a composition formula of $In_{x5}Al_{y2}Ga_{1-x5-y2}N$ (0≤x5≤1, 0≤y2≤1, and 0≤x5+y2≤1), or a material selected from the group consisting of AlInN, AlGaAs, GaP, GaAs, GaAsP, and AlGaInP. When the second dopant is a P-type dopant such as Mg, Zn, Ca, Sr, Ba, or the like, the second conductive semiconductor layer 112 doped with the second dopant may be a P-type semiconductor layer.

The light-emitting structure 110 may be formed using a method of physical vapor deposition (PVD), chemical vapor deposition (CVD), plasma laser deposition (PLD), thermal evaporation, sputtering, electron beam (E-beam) deposition, metal organic chemical vapor deposition (MOCVD), plasma-enhanced chemical vapor deposition (PECVD), molecular beam epitaxy (MBE), hydride vapor phase epitaxy (HVPE), or the like, but the present invention is not limited thereto.

Figure 15:
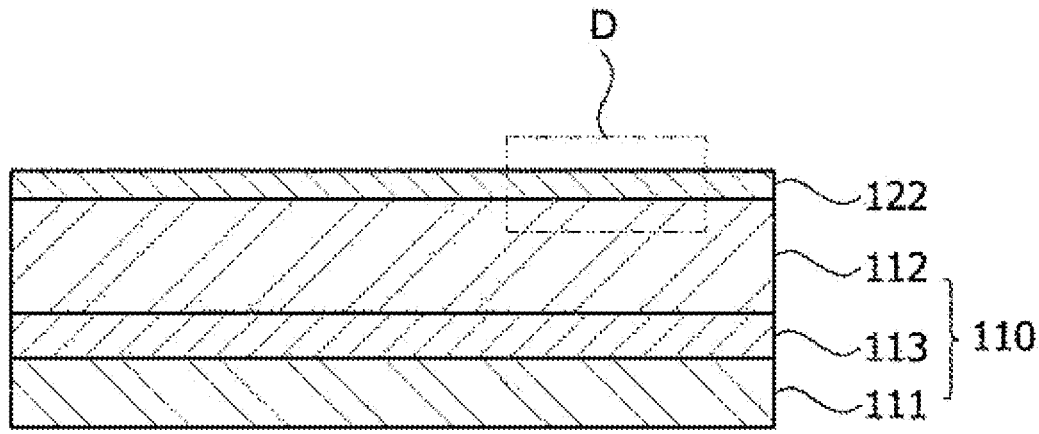

Referring to FIG. 15, the electrode 122 may be formed on one surface of the light-emitting structure 110. The electrode 122 may be in ohmic contact with the second conductive semiconductor layer 112.

The electrode 122 may be formed using a method of PVD, CVD, PLD, thermal evaporation, sputtering, E-beam deposition, MOCVD, PECVD, MBE, HVPE, or the like, but the present invention is not limited thereto.

Figure 16A:
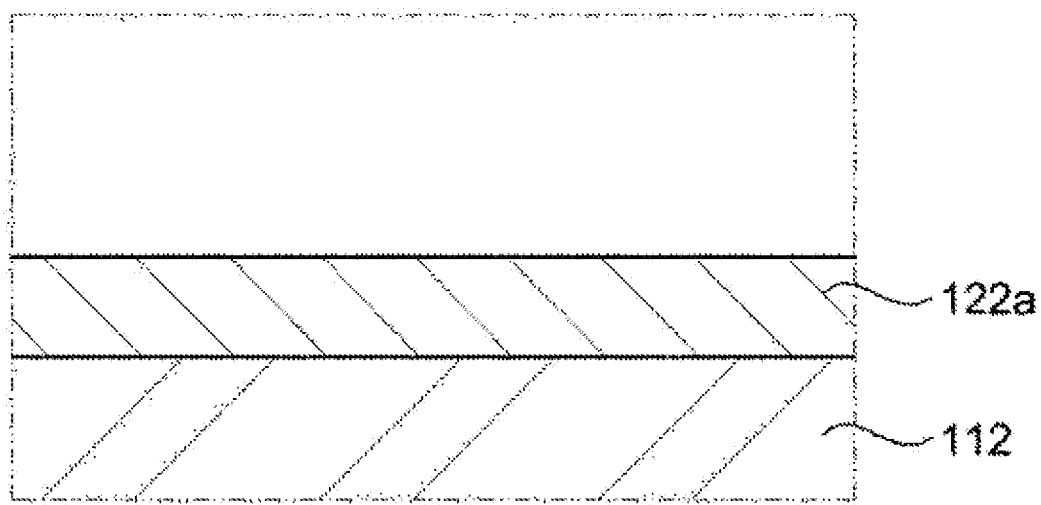
Figure 16B:
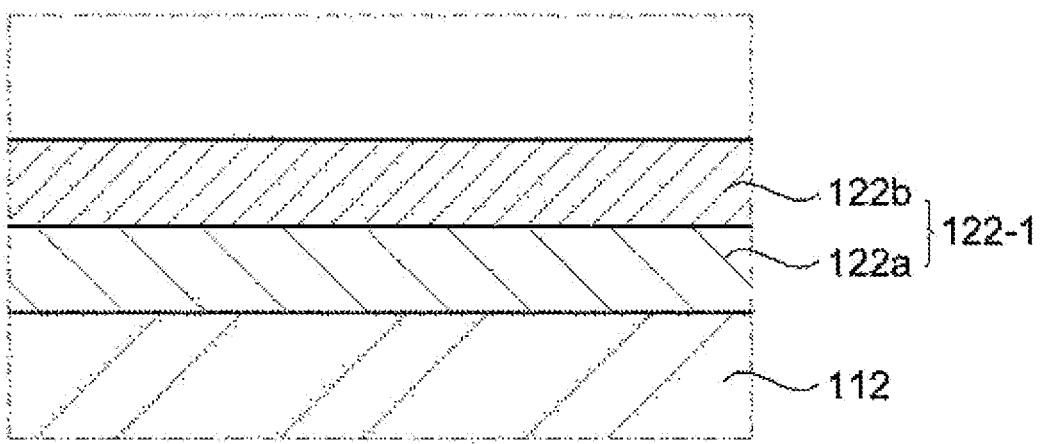
Figure 17A:
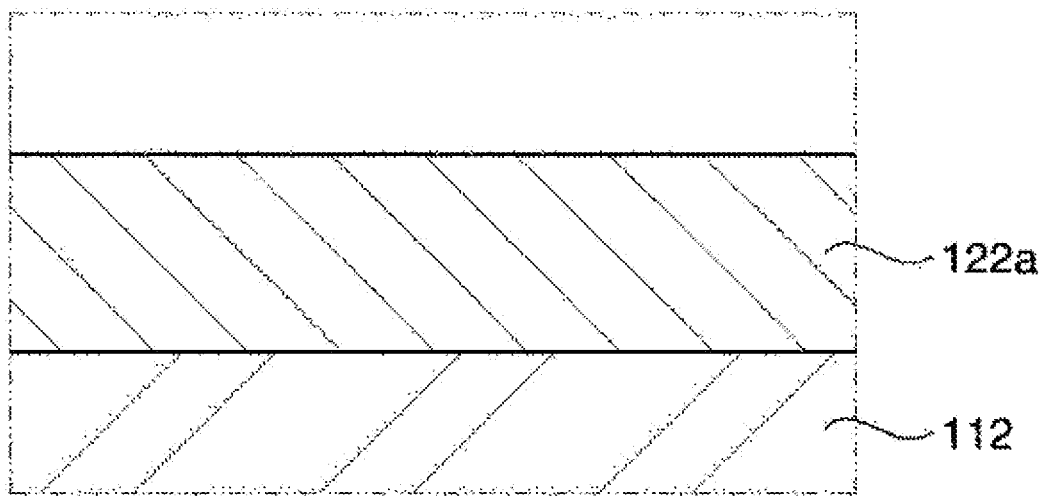
Figure 17B:
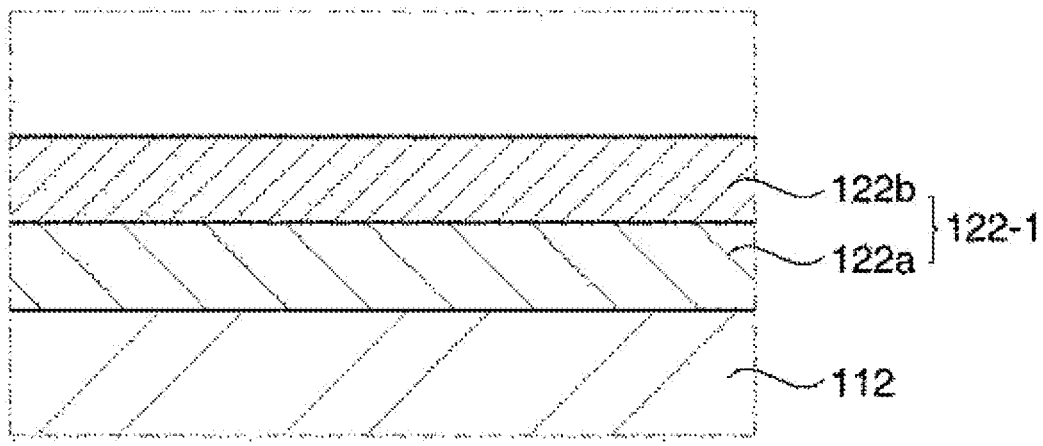
Figure 18:
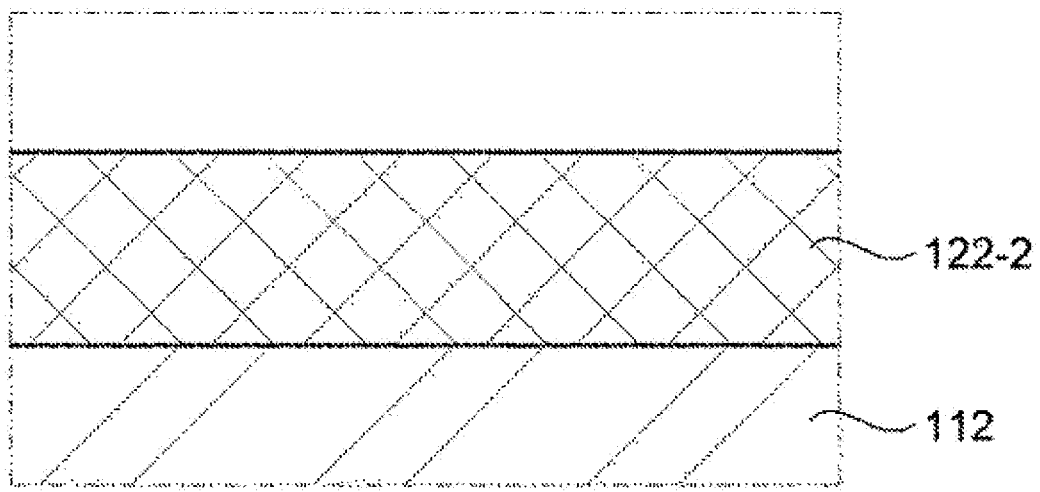

Meanwhile, in the operation of forming the electrode 122 in the method of manufacturing the semiconductor device according to the embodiments of the present invention, FIGS. 16A and 16B are enlarged views of a portion D of FIG. 5 for describing a method of forming an electrode according to the first embodiment of the present invention, FIGS. 17A and 17B are enlarged views of a portion D of FIG. 5 for describing a method of forming an electrode according to the second embodiment of the present invention, and FIG. 18 is an enlarged view of a portion D of FIG. 5 for describing a method of forming an electrode according to the third embodiment of the present invention.

A method of forming the second electrode 122-1 according to the first embodiment will be described with reference to FIGS. 16A and 16B as follows.

Referring to FIG. 16A, a first layer 122a may be formed on the second conductive semiconductor layer 112. The first layer 122a may include a metal oxide. Specifically, the first layer 122a may include a TCO film which absorbs a relatively small amount of UV light. The TCO film may be formed of one selected from ITO, IZO, AZO, AGZO, IZTO, IAZO, IGZO, IGTO, ATO, GZO, IZON, ZnO, $IrO_x$, $RuO_x$, NiO, and the like.

Referring to FIG. 16B, a second layer 122b may be deposited on the first layer 122a. The second layer 122b may include a metal oxynitride. Specifically, the second layer 122b may be made of a compound (e.g., ITON) of a TCO film and nitrogen. To this end, the TCO film (e.g., a compound of $In_2O_3$ and $SnO_2$ when the TCO film is made of ITO) may be used as a target. Further, a deposition gas may include nitrogen ($N_2$). Further, argon (Ar) may be further included as the deposition gas. As nitrogen is used as the deposition gas, atoms which are released from the target may be deposited together with the nitrogen to form the second layer 122b.

Among nitrogen and argon, which are deposition gases, a content ratio of the nitrogen may range from 40 to 100%. When the content ratio of nitrogen is less than 40%, a compound is not sufficiently generated between the TCO film and the nitrogen so that an adhesive force between the electrode 122 and the reflective layer 142 may be lowered.

A content ratio of nitrogen contained in the second layer 122b may be in a range of 0.33 to 1.5 times a content ratio of oxygen. When the content ratio of the nitrogen in the second layer 122b is less than 0.33 times the content ratio of the oxygen, an amount of oxide which is larger than that of nitrogen may be formed between the second electrode 122-1 and the reflective layer 142, which is undesirable. When the content ratio of the nitrogen in the second layer 122b is greater than 1.5 times the content ratio of the oxygen, the content ratio of the oxygen becomes relatively small so that a bonding force between elements constituting the second layer may be reduced.

A thickness of the first layer 122a may range from 1 to 10 nm. When the thickness of the first layer 122a is greater than 10 nm, the transmittance may be lowered so that light loss may occur, which is undesirable. Further, when the thickness of the first layer 122a is less than 1 nm, cracks may easily generated due to an external impact and the resistance may be increased so that current injection efficiency may be lowered, which is undesirable.

A thickness of the second layer 122b may range from 1 to 10 nm. When the thickness of the second layer 122b is greater than 10 nm, the transmittance may be lowered so that light loss may occur, which is undesirable. Further, when the thickness of the second layer 122b is less than 1 nm, the adhesive force between the first layer 122a and the reflective layer 142 may be lowered and an anti-oxidizing effect may be reduced, which is undesirable.

That is, the thickness of the second layer 122b may be in a range of 0.1 to 10 times the thickness of the first layer 122a. When the thickness of the second layer 122b is less than 0.1 times the thickness of the first layer 122a, the adhesive force between the first layer 122a and the reflective layer 142 may be lowered and the anti-oxidizing effect may be reduced, which is undesirable. When the thickness of the second layer 122b is greater than 10 times the thickness of the first layer 122a, the transmittance may be lowered so that light loss may occur the transmittance may be lowered so that light loss may occur, which is undesirable.

As described above, according to the method of forming the electrode according to the first embodiment, an electrode layer 122-1 may be formed by sequentially depositing the first layer 122a and the second layer 122b on the second conductive semiconductor layer 112.

A method of forming the second electrode 122-1 according to the second embodiment will be described with reference to FIGS. 17A and 17B as follows.

Referring to FIG. 17A, a first layer 122a may be formed on the second conductive semiconductor layer 112. A material of the first layer 122a is identical to that described in the method of forming the electrode according to the first embodiment.

Referring to FIG. 17B, the first layer 122a may be surface-treated to form a second layer 122b. That is, one surface of the first layer 122a may be doped with nitrogen to form a second layer 122b made of a compound of a TCO film and nitrogen. A material of the second layer 122b is identical to that described in the method of forming the electrode according to the first embodiment.

A thickness of each of the first layer 122a and the second layer 122b may range from 1 to 10 nm as described above. Further, the thickness of the second layer 122b may be in a range of 0.1 to 10 times the thickness of the first layer 122a.

As described above, according to the method of forming the electrode according to the second embodiment, one surface of the first layer 122a may be surface-treated to form the second layer 122b using a nitrogen doping process or an ion implantation process.

A method of forming an electrode 122-2 according to the third embodiment will be described with reference to FIG. 18 as follows.

Referring to FIG. 18, a second electrode 122-2 may be deposited on the second conductive semiconductor layer 112. In this case, the second electrode 122-2 may include a metal oxynitride. Specifically, the second electrode 122-2 may be made of a compound of a TCO film and nitrogen. A material and deposition method of the second electrode 122-2 may be identical to the material and forming method of the second layer 122b of the first embodiment.

Figure 19:
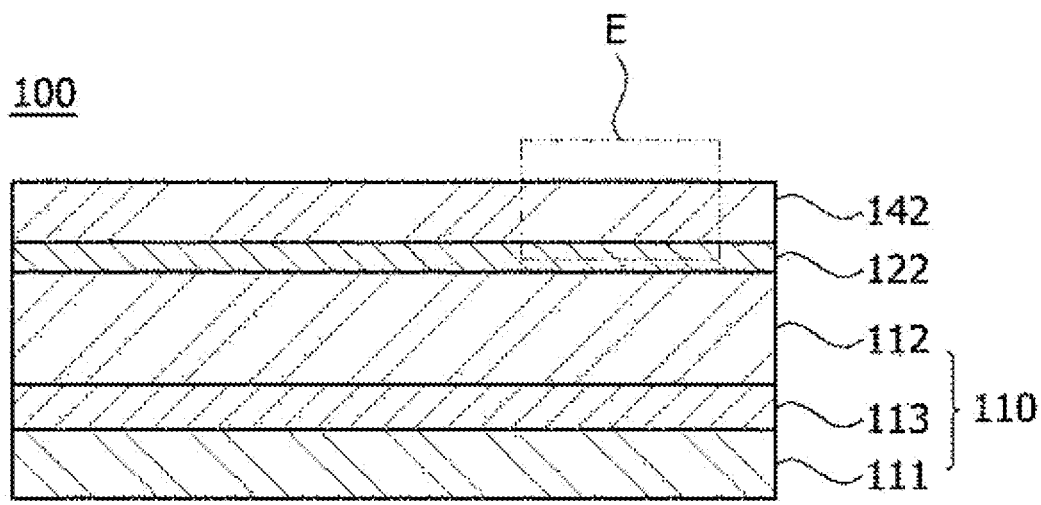

Referring to FIG. 19, a reflective layer 142 is formed on the electrode 122. The reflective layer 142 may be made of a material having high reflectance. The reflective layer 142 may include a first metal. For example, the reflective layer 142 may include aluminum.

The reflective layer 142 may be formed using a method of PVD, CVD, PLD, thermal evaporation, sputtering, E-beam deposition, MOCVD, PECVD, MBE, HVPE, or the like, but the present invention is not limited thereto.

Figure 20A:
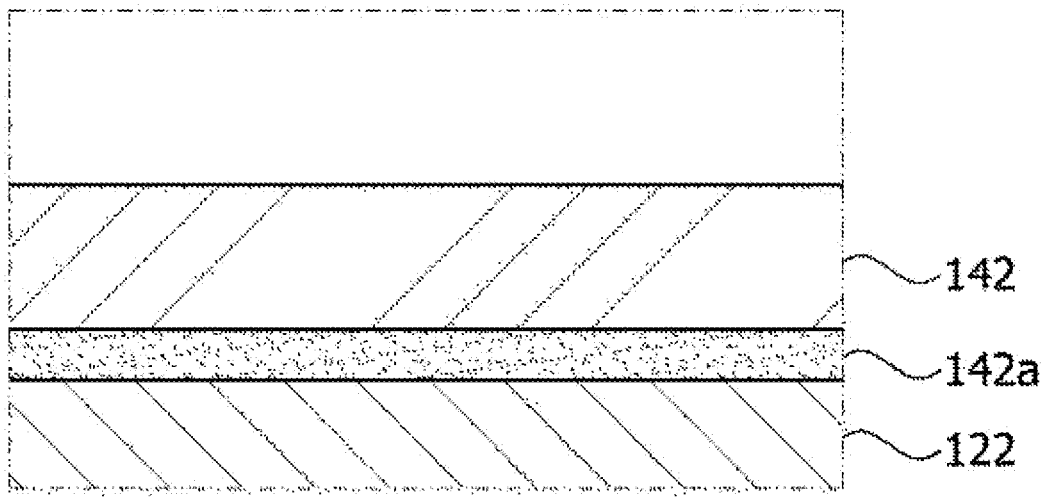
Figure 20B:
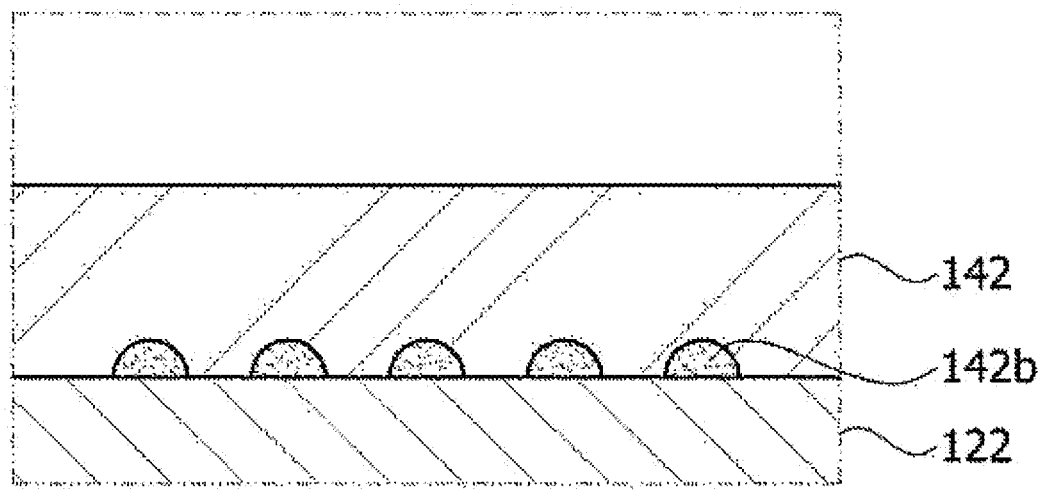

FIG. 20A is an enlarged view of a portion E of FIG. 19 according to the first modified example and FIG. 20B is an enlarged view of the portion E of FIG. 19 according to the second modified example.

Referring to FIGS. 20A and 20B, after the formation of the reflective layer 142, a compound may be formed at an interface between the reflective layer 142 and the electrode 122. That is, intermediate portions 142a and 142b may be formed between the reflective layer 142 and the electrode 122. The intermediate portions 142a and 142b may be compounds formed by reacting a material contained in the reflective layer with a material contained in the second electrode.

The intermediate portion 142a according to the first modified example may be disposed in the form of a layer in an entire region between the second layer 122b and the reflective layer 142. The intermediate portion 142b according to the second modified example may be disposed in the form of a cluster in a part of a region between the second layer 122b and the reflective layer 142. Alternatively, an intermediate portion may be provided in the form of a combination of the first and second modified examples.

The intermediate portion 142a may include a nitrogen compound formed by the first metal contained in the reflective layer 142 and the nitrogen in the electrode 122. Further, the intermediate portion 142a may include an oxygen compound formed by the first metal contained in the reflective layer 142 and the oxygen in the electrode 122.

A content ratio of nitride in the intermediate portions 142a and 142b is greater than a content ratio of oxide. That is, the nitrogen in the second layer 122b has higher diffusivity into the reflective layer 142 than the oxygen has. A ratio of nitride to oxide may be 2.3:1 or more. When the ratio of nitride to oxide is less than 2.3:1, a content ratio of the oxide may become relatively large so that the second layer 122b and the reflective layer 142 may be delaminated, or the resistance may be increased so that current injection efficiency may be lowered.

Experimental Example

Reflectance Measurement

In the semiconductor device 100 shown in FIG. 1, the second electrode 122-1 and the reflective layer 142 were formed to measure reflectance for each wavelength. In this case, the second electrode 122-1 had a structure of the first layer 122a and the second layer 122b.

The second layer among the first layer 122a, the second layer 122b, and the reflective layer 142 was formed of a different material to construct Comparative Examples 1, 2, and 3 and Example 1. Here, all of the components except for the second layer 122b were formed of the same material. Particularly, an ITO film, which is a TCO film, was used for the first layer 122a and aluminum (Al) was used for the reflective layer 142. Equipment of Applied Materials, Inc. (AMAT) or equipment of photochemical reflectance index (PRI) may be used as reflectance measurement equipment.

Figure 21A:
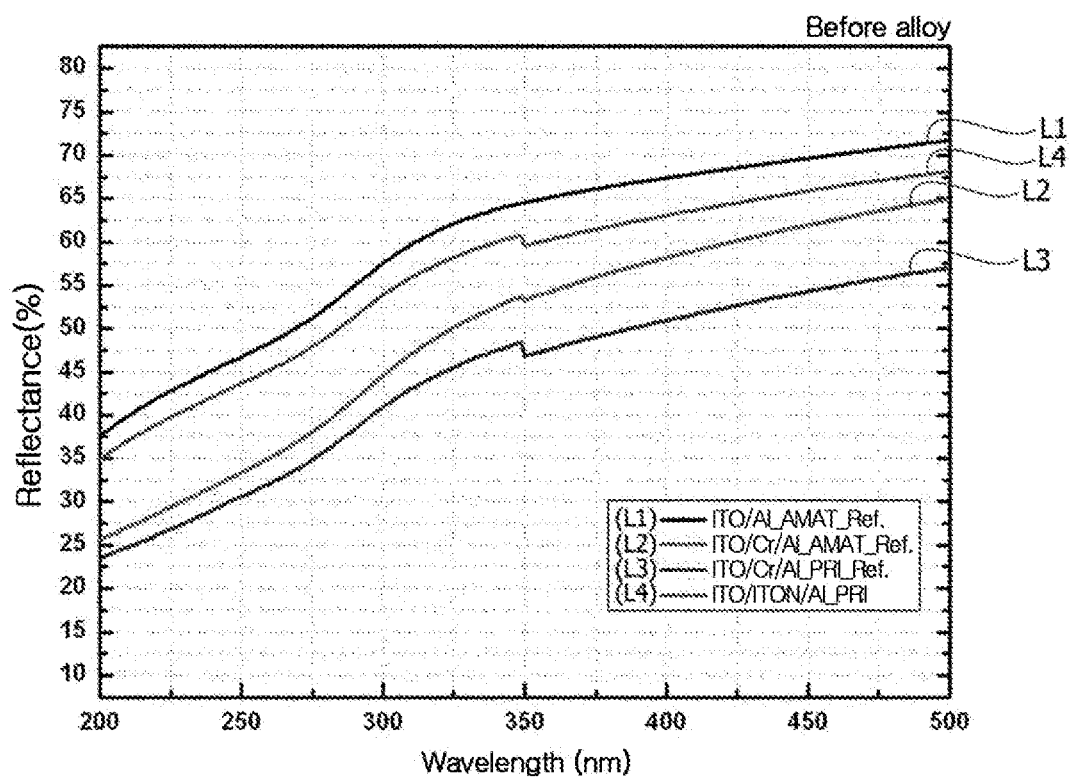
FIGS. 21A and 21B are graphs showing reflectance for each wavelength measured according to a material of a second layer of a second electrode of a semiconductor device according to an embodiment of the present invention.
Figure 21B:
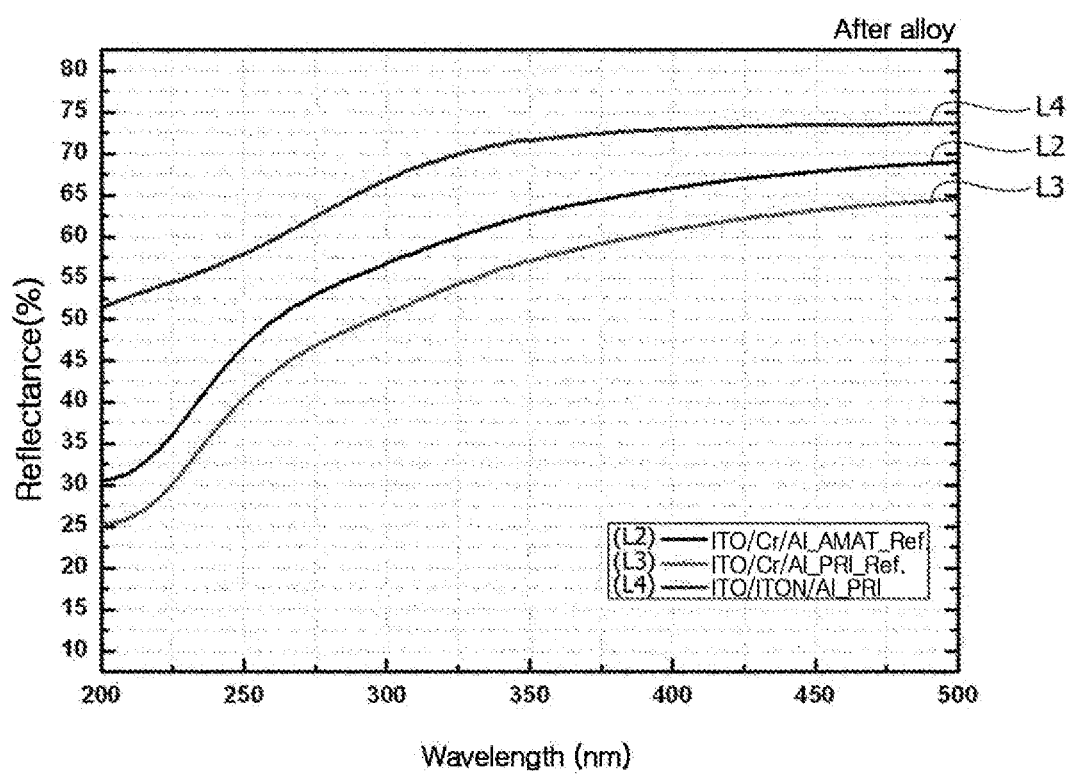

FIGS. 21A and 21B are graphs showing measured reflectance for each wavelength in Comparative Examples 1, 2, and 3 and Example 1. Here, L1 represents the reflectance in Comparative Example 1, L2 represents the reflectance in Comparative Example 2, L3 represents the reflectance in Comparative Example 3, and L4 represents the reflectance in Example 1. FIG. 21A is a graph showing reflectance for each wavelength before alloying (before a thermal process) the first layer, the second layer, and the reflective layer. FIG. 21B is a graph showing for each wavelength after alloying (after the thermal process) the first layer, the second layer, and the reflective layer. Table 1 and Table 2 show reflectance at a wavelength of 280 nm in FIGS. 21A and 21B, respectively.

TABLE 1

|  | Structure (First layer/ Second layer/ Reflective layer) | Reflectance (%) (@280 nm) |
| --- | --- | --- |
| Comparative Example 1 (AMAT) | ITO/Al | 52.3 |
| Comparative Example 2 (AMAT) | ITO/Cr/Al | 39.2 |
| Comparative Example 3 (PRI) | ITO/Cr/Al | 35.9 |
| Example 1 (PRI) | ITO/ITON/Al | 48.9 |

TABLE 2

| | Structure (First layer/<br>Second layer/<br>Reflective layer) | Reflectance<br>(%)<br>(@280 nm) |
|---|---|---|
| Comparative Example 1 (AMAT) | ITO/Al | — |
| Comparative Example 2 (AMAT) | ITO/Cr/Al | 53.8 |
| Comparative Example 3 (PRI) | ITO/Cr/Al | 47.6 |
| Example 1(PRI) | ITO/ITON/Al | 63.3 |

In Comparative Example 1, the reflective layer was directly disposed on the first layer without the second layer therebetween, and thus the highest reflectance was exhibited. Referring to FIG. 21A and Table 1, it can be seen that the reflectance for each wavelength is the highest in Comparative Example 1. However, when the first layer (ITO) and the reflective layer (Al) were directly bonded to each other, the electrode and the reflective layer were delaminated due to an oxide compound ($Al_xO_y$) formed therebetween and electrical properties were degraded. Therefore, Comparative Example 1 is not preferable.

In Comparative Example 2 and Comparative Example 3, the reflectance was measured using only equipment differently under the same conditions. That is, chromium (Cr) was applied as the second layer to measure the reflectance. Referring to FIGS. 21A and 21B, it can be seen that the reflectance in Comparative Example 1 is higher than that in Comparative Example 2. Particularly, referring to Table 1 and Table 2, in Comparative Example 2, excellent reflectance was exhibited both before and after the heat treatment. That is, it can be seen that the reflectance measured using the AMAT equipment used in Comparative Example 2 is higher than that measured using the PRI equipment.

In Example 1, ITON was applied as the second layer. Referring to FIGS. 21A and 21B and Tables 1 and 2, it can be seen that the reflectance in Example 1 is significantly higher than that of each of Comparative Examples 1 and 2 in which chromium is used. Further, referring to Table 1, there was only a 3.4% difference between the reflectance in Example 1 and that in Comparative Example 1 in which an intermediate layer was not used, and thus it can be seen that the reflectance is significantly excellent in Example 1. In addition, it is expected that a higher reflectance may be obtained when being measured using the AMAT equipment. Therefore, a semiconductor device having high reflectance at an equal level of that of Comparative Example 1 may be manufactured.

Thin Film Evaluation of Second Layer

Figure 22:
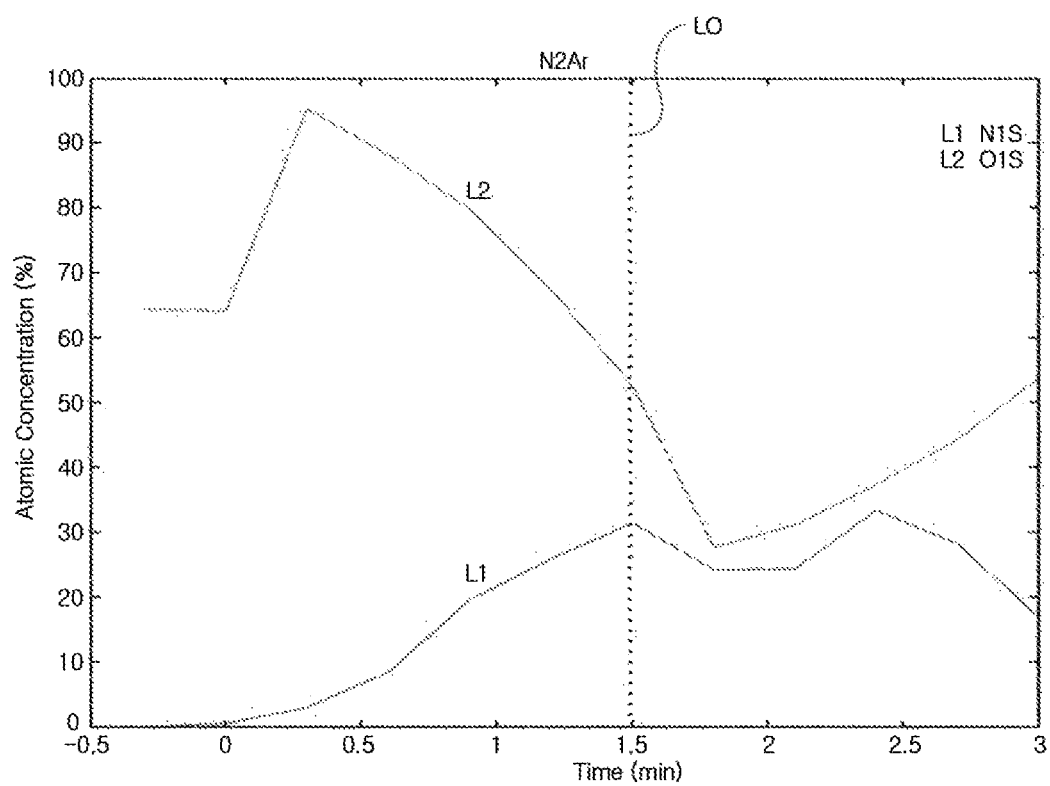
FIGS. 22 and 23 are graphs showing a result of an X-ray photoelectron spectroscopy (XPS) analysis for a second layer of a second electrode of a semiconductor device according to an embodiment of the present invention.

FIG. 22 is a graph showing a result of an XPS analysis for the second layer in the case in which a ratio of $N_2$:Ar serving as deposition gases is set to 3:2. Samples having a structure of ITON and sapphire were used as analytical samples. In this case, a thickness of ITON was 8 nm. In XPS analysis, a surface of the ITON may be coated with Ti to prevent the concentration of charges during the analysis. Here, a left side with respect to a central line L0 represents a portion to which Ti is applied and a right side represents a portion in which ITON is deposited. In addition, L1 denotes a content ratio of nitrogen and L2 denotes a content ratio of oxygen.

Referring to FIG. 22, it can be seen that nitrogen is detected in the ITON region. Here, oxygen was contained in a greater ratio than nitrogen. This is because ITO contained in ITON is a compound of $In_2O_3$ and $SnO_2$. Therefore, in the ITON, the diffusivity of the nitrogen is higher than that of the oxygen. As a result, even when the content ratio of the oxygen is somewhat high, the nitride is more easily generated than the oxide among the compounds (the intermediate portion 142a in FIG. 3A or the intermediate portion 142b in FIG. 3C) formed between the reflective layer and the electrode. Therefore, an adhesive force between the electrode and the reflective layer may be increased.

Figure 23:
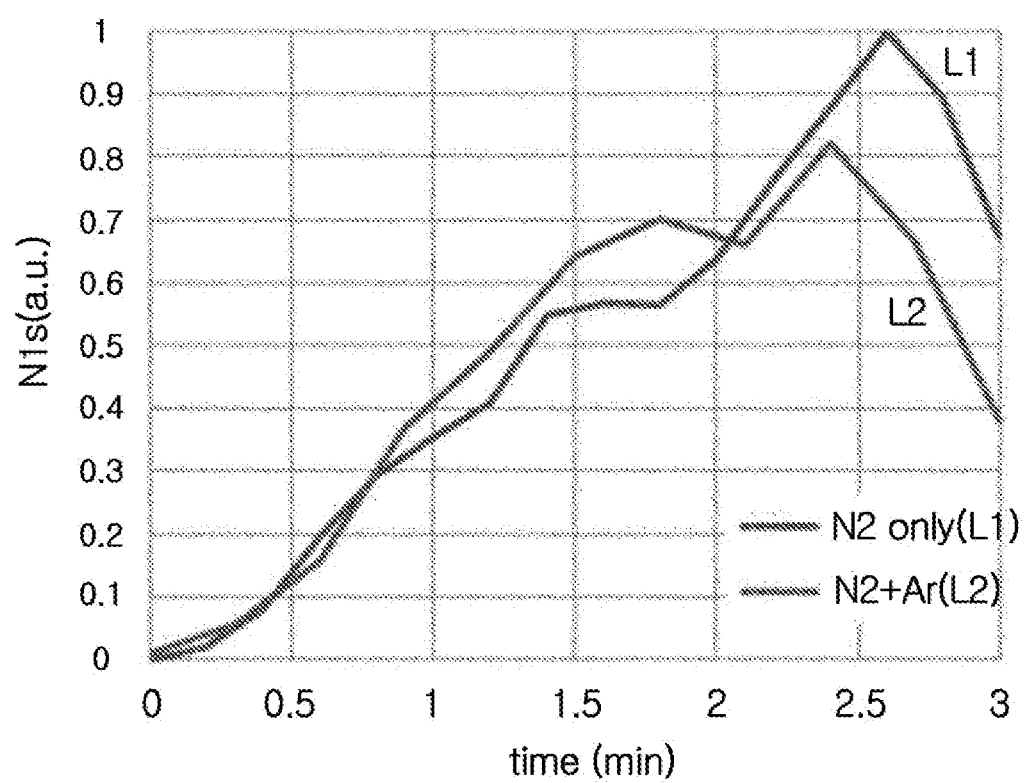

FIG. 23 is a graph showing a result of an XPS analysis for a second layer in the case in which a deposition gas is composed of 100% $N_2$ and a second layer and in the case in which a deposition gas is composed of 60% $N_2$ and 40% Ar. Here, samples having a structure of ITON and sapphire, which is identical to that in FIG. 22, were used as analytical samples. Further, the analytical samples may be coated with Ti. As described in FIG. 22, a right side with respect to 1.5 of an X axis represents a portion in which ITON is formed.

Referring to FIG. 23, it can be seen that an atomic ratio of nitrogen becomes higher when the deposition gas is made of only nitrogen. That is, it can be seen that a content ratio of nitrogen in the second layer is increased as the content ratio of the nitrogen in the deposition gas is increased. Therefore, the content ratio of the nitride between the reflective layer and the second layer (ITON) may be increased by increasing the content ratio of the nitrogen used as the deposition gas. Accordingly, an adhesive force between the electrode (ITO) and the reflective layer (Al) may be further improved.

The semiconductor device may be used as a light source of a lighting system, or as a light source of an image display device or a lighting device. That is, the semiconductor device may be applied to various electronic devices which are arranged in cases to provide light. For example, when the semiconductor device and a red-green-blue (RGB) phosphor are mixed and used, white light having an excellent color rendering index (CRI) may be realized.

The semiconductor device described above may be composed of a light-emitting element package and may be used as a light source of a lighting system, for example, as a light source of an image display device or a lighting device.

When the semiconductor device is used as a backlight unit of an image display device, the semiconductor device may be used as an edge type backlight unit or as a direct-type backlight unit, and when the semiconductor device is used as a light source of a lighting device, the semiconductor device may be used as a regulator or bulb type or as a light source of a mobile terminal.

Light-emitting elements include laser diodes in addition to the light-emitting diode described above.

The laser diode may include a first conductivity semiconductor layer, an active layer, and a second conductivity semiconductor layer having the same structure as the above-described structure of the light-emitting element. Further, in the laser diode, an electro-luminescence phenomenon, in which a P-type first conductive semiconductor and an N-type second conductive semiconductor are bonded and then light is emitted when a current flows, is used. However, there is a difference in a direction and phase of the emitted light. That is, the laser diode may emit light having a specific wavelength (a monochromatic beam) in the same direction with the same phase using a stimulated emission phenomenon and a constructive interference phenomenon. Due to such characteristics, the laser diode may be used for optical communication, medical equipment, semiconductor processing equipment, or the like.

A photodetector, which is a type of transducer that detects light and converts the intensity of the light into an electric signal, may be exemplified as a light-receiving element. Such a photodetector includes photovoltaic cells (silicon or selenium), optical output elements (cadmium sulfide or cadmium selenide), photodiodes (PDs) (e.g., a PD having a peak wavelength in a visible blind spectral region or a true blind spectral region), photo transistors, photoelectron booster tubes, photo tubes (vacuum or gas filling), infra-red (IR) detectors, and the like, but the embodiments are not limited thereto.

Further, semiconductor devices such as photodetectors may be generally manufactured using direct bandgap semiconductors having excellent photo-conversion efficiency. Alternatively, the photodetectors have various structures, and the most general structures thereof include a pin-type photodetector using a p-n junction, a Schottky type photodetector using a Schottky junction, a metal semiconductor metal (MSM) type photodetector, and the like.

The PD may include a first conductivity semiconductor layer, an active layer, and a second conductivity semiconductor layer having the same structure as the above-described structure of the light-emitting element. The PD operates by applying reverse bias or zero bias. When light is incident on the PD, electrons and holes are generated and a current flows. In this case, a magnitude of the current may be approximately proportional to the intensity of the light incident on the PD.

A photovoltaic cell or a solar cell is a type of PD that can convert light into a current. The solar cell may include a first conductivity semiconductor layer, an active layer, and a second conductivity semiconductor layer having the same structure as the above-described structure of the light-emitting element.

Further, the semiconductor device may be used as a rectifier of an electronic circuit through a general rectifying characteristic of a diode using a p-n junction and may be applied to an oscillation circuit or the like by being applied to a super high frequency circuit.

Further, the above-described semiconductor device is not necessarily implemented with only a semiconductor and may further include a metal material in some cases. For example, a semiconductor device, such as a light-receiving element, may be implemented using at least one of Ag, Al, Au, In, Ga, N, Zn, Se, P, and As, or may be implemented using a semiconductor material, which is doped with a P-type or N-type dopant, or an intrinsic semiconductor material.

While the present invention has been particularly described with reference to the embodiments, the embodiments are only exemplary embodiments of the present invention. It will be understood by those skilled in the art that modified examples and applications in other forms may be made without departing from the spirit and scope of the present invention. For example, each component specifically shown in the embodiments may be modified and embodied. In addition, it should be understood that differences related to these modified examples and applications are within the scope of the present invention as defined in the appended claims.

The invention claimed is:

1. A semiconductor device comprising:
a light-emitting structure including a first conductive semiconductor layer, a second conductive semiconductor layer, and an active layer disposed between the first conductive semiconductor layer and the second conductive semiconductor layer;
a first electrode electrically connected to the first conductive semiconductor layer;
a second electrode electrically connected to the second conductive semiconductor layer; and
a reflective layer disposed on the second electrode and including a first metal, wherein:
the reflective layer reflects light in an ultraviolet wavelength band, which is emitted from the active layer,
the second electrode includes a first layer and a second layer disposed between the first layer and the reflective layer,
the first layer includes a metal oxide,
the second layer includes a metal oxynitride,
a region between the second layer and the reflective layer includes a nitride of the first metal and an oxide of the first metal,
a content ratio of nitrogen contained in the second layer is in a range of 0.33 to 1.5 times a content ratio of oxygen, and
in the region between the second layer and the reflective layer, an amount of the nitride of the first metal is greater than that of the oxide of the first metal.

2. The semiconductor device of claim 1, wherein the second layer has a thickness of 0.1 to 10 times that of the first layer.

3. The semiconductor device of claim 1, wherein the nitride of the first metal is disposed in at least a part of a region between the second electrode and the reflective layer.

4. The semiconductor device of claim 1, wherein:
the oxide of the first metal is further included between the second electrode and the reflective layer; and
a content ratio of the oxide of the first metal to the nitride of the first metal is 1:2.3 or more at an interface between the second electrode and the reflective layer.

5. The semiconductor device of claim 1, wherein:
the light-emitting structure further includes a plurality of recesses which pass through the second conductive semiconductor layer and the active layer and are disposed to a part of a region of the first conductive semiconductor layer; and
the first electrode is disposed inside the plurality of recesses.

6. The semiconductor device of claim 1, wherein the first layer includes ITO and the second layer includes ITON.

7. The semiconductor device of claim 1, wherein a thickness of the first layer is in a range of 1 to 10 nm.

8. The semiconductor device of claim 1, wherein a thickness of the second layer is in a range of 1 to 10 nm.

9. The semiconductor device of claim 1, further comprising an intermediate portion disposed between the second layer and the reflective layer,
wherein the intermediate portion comprises AlN or $Al_xO_y$.

10. The semiconductor device of claim 1, wherein the second conductive semiconductor layer includes a surface layer contacted with the second electrode, and
wherein a composition of aluminum in the surface layer of the second conductive semiconductor layer is range from 1% to 10%.

11. A semiconductor device package comprising:
a body; and
a semiconductor device disposed in the body,
wherein the semiconductor device includes
a light-emitting structure including a first conductive semiconductor layer, a second conductive semiconductor layer, and an active layer disposed between the first conductive semiconductor layer and the second conductive semiconductor layer,
a first electrode electrically connected to the first conductive semiconductor layer,
a second electrode electrically connected to the second conductive semiconductor layer, and a reflective layer disposed on the second electrode and including a first metal, wherein:
the reflective layer reflects light in an ultraviolet wavelength band, which is emitted from the active layer,
the second electrode includes a first layer and a second layer disposed between the first layer and the reflective layer,
the first layer includes a metal oxide,
the second layer includes a metal oxynitride,
a region between the second layer and the reflective layer includes a nitride of the first metal and an oxide of the first metal,
a content ratio of nitrogen contained in the second layer is in a range of 0.33 to 1.5 times a content ratio of oxygen, and
in the region between the second layer and the reflective layer, an amount of the nitride of the first metal is greater than that of the oxide of the first metal.

12. The semiconductor device package of claim 11, wherein:
the oxide of the first metal is further included between the second electrode and the reflective layer; and
a content ratio of the oxide of the first metal to the nitride of the first metal is 1:2.3 or more at an interface between the second electrode and the reflective layer.

13. The semiconductor device package of claim 11, wherein:
the light-emitting structure further includes a plurality of recesses which pass through the second conductive semiconductor layer and the active layer and are disposed to a part of a region of the first conductive semiconductor layer; and
the first electrode is disposed inside the plurality of recesses.

14. The semiconductor device package of claim 11, wherein the first layer includes ITO and the second layer includes ITON.

15. The semiconductor device package of claim 11, wherein a content ratio of nitrogen contained in the second layer is in a range of 0.33 to 1.5 times a content ratio of oxygen.

16. The semiconductor device package of claim 11, further comprising an intermediate portion disposed between the second layer and the reflective layer, and
wherein the intermediate portion comprising AlN or $Al_xO_y$.

17. The semiconductor device package of claim 11, wherein the second conductive semiconductor layer includes a surface layer contacted with the second electrode, and
wherein a composition of aluminum in the surface layer of the second conductive semiconductor layer is range from 1% to 10%.

* * * * *